United States Patent [19]

Gulick

[11] Patent Number: 5,512,893
[45] Date of Patent: Apr. 30, 1996

[54] KEYPAD SCANNER PROCESS AND DEVICE AND CORDLESS TELEPHONE EMPLOYING THE MECHANISM

[75] Inventor: Dale E. Gulick, Austin, Tex.

[73] Assignee: Advanced Micro Devices, Inc., Sunnyvale, Calif.

[21] Appl. No.: 464,072

[22] Filed: Jun. 5, 1995

Related U.S. Application Data

[63] Continuation of Ser. No. 918,625, Jul. 21, 1992, abandoned.

[51] Int. Cl.⁶ .......................... H03K 17/94; H04M 1/00
[52] U.S. Cl. ..................... 341/26; 341/22; 341/24; 379/368
[58] Field of Search ......................... 379/368, 355, 379/361, 61, 62; 341/22, 24, 25, 26; 178/18

[56] References Cited

U.S. PATENT DOCUMENTS

| | | | |
|---|---|---|---|
| 4,109,315 | 8/1978 | Dan | 341/25 X |
| 4,301,326 | 11/1981 | Hetzel et al. | 178/18 |
| 4,344,069 | 8/1982 | Prame | 341/26 |
| 4,731,814 | 3/1988 | Becker et al. | 379/62 |
| 4,857,898 | 8/1989 | Smith | 341/22 |
| 4,924,496 | 5/1990 | Figa et al. | 379/355 X |
| 5,014,295 | 5/1991 | Kunihiro | 379/61 |
| 5,117,455 | 5/1992 | Danish | 379/368 |
| 5,192,947 | 3/1993 | Neustein | 341/22 X |

*Primary Examiner*—Jeffery Hofsass
*Assistant Examiner*—Devendra T. Kumar
*Attorney, Agent, or Firm*—Jenkens & Gilchrist

[57] ABSTRACT

A keypad scanner mechanism which may be incorporated with an integrated circuit including a microcontroller. The keypad scanner mechanism includes a keypad with more than one key. The keypad scanner mechanism has an activity detect mode and a normal mode. In the activity detect mode, the keypad scanner mechanism wakes up the integrated circuit and triggers the normal mode. In the normal mode, the keypad scanner mechanism identifies and reports to the microcontroller the depression of keys on the keypad. The keypad scanner mechanism also includes a means for debouncing, a multiple keys down code, and a no keys down code. The keypad scanner mechanism is suitable for any keypad application, however, it has been found that the keypad scanner mechanism is especially suitable for incorporation into the base and handset units of a cordless telephone that integrates the speech, control channels, and microcontroller portions of a modem, and the man-machine interface functions of a cordless telephone.

8 Claims, 15 Drawing Sheets

KEYPAD SCANNER PROCESS AND DEVICE AND CORDLESS TELEPHONE EMPLOYING THE MECHANISM

This application is a continuation of Ser. No. 07/918,625, filed Jul. 21, 1992, now abandoned.

CROSS-REFERENCE TO RELATED APPLICATIONS

This application is related to the following U.S. Patents and patent applications:

| Patents and U.S. Pat. applications: | | |
| --- | --- | --- |
| U.S. PAT. NO./ SER. NO. | TITLE | INVENTOR(S) |
| 5,448,743 | General I/O Port Interrupt Mechanism | Gulick, et al. |
| 5,408,639 | Improved External Memory Access Control for a Processing Unit | Gulick, et al. |
| 07/917,488 | Method of Weak Pull-up Disable and Mechanism Therefor for Use with Microcontroller in Integrated Circuit and Cordless Telephone Using the Integrated Circuit | Bowles, et al. |
| 07/917,503 | Interrupt Mask Disable Circuit and Method | Bowles, et al. |
| 07/918,627 | Integrated Circuit and Cordless Telephone Using the Integrated Circuit | Gulick, et al. |
| 07/918,626 | Modulator Test System | Peterson, et al. |
| 5,404,459 | Serial Interface Module and Method | Gulick, et al. |
| 07/918,631 (abandoned) | Low Powder Emergency Telephone Mode | Peterson, et al. |
| 07/918,632 | In-Circuit Emulation Capability Mode in Integrated Circuit and Cordless Telephone Using the Integrated Circuit | Gulick, et al. |
| 07/918,622 (abandoned) | Clock Generator Capable of Shut-down Mode and Clock Generation Method | Peterson, et al. |
| 5,420,904 | Signal Averager | Gulick |

All of the related applications are filed on even date herewith, are assigned to the assignee of the present invention, and are hereby incorporated herein in their entirety by this reference thereto.

BACKGROUND OF THE INVENTION

1. Field of the Invention

The present invention relates to a keypad scanner mechanism and process and, more particularly, to such a keypad scanner mechanism and process for use in a cordless telephone.

2. Description of Related Art

A keypad is a common device for communicating with a microcontroller or other electronic circuitry and devices. In a microcontroller application, the software controlling the microcontroller identifies pressed keys of the keypad as a signal to the microcontroller to perform certain functions. A keypad consisting of an array of keys is essentially a collection of switches, each key forming a switch. Each switch (i.e., key) may be connected independently to an input port of a device, for example, a microcontroller, to which the keypad serves as an input. The interfacing and programming necessary to allow input to the device via the keypad is similar to the interfacing and programming necessary for accomplishing similar results with any other collection of switches.

Generally, the software for interpreting signals from a keypad must perform the tasks listed below:

1. Determine if any keys have been pressed;
2. If a key has been pressed, determine which one; and
3. Decide on an action, for example, data entry, based on the key that was pressed.

The software must perform these tasks in response to a number of activities on the keypad.

An integral element which detects the particular activities on a keypad and allows the activities to be acted upon by the device to which the keypad provides input is a keypad scanner mechanism. The keypad scanner mechanism is the device and process by which the rows and columns of a matrix keypad are examined to determine whether keys have been press ed and, if so, which keys.

When a key on a keypad is pressed, the keypad scanner mechanism detects a number of things that happen. First, the keypad scanner mechanism detects that a key has transmissioned from its open state to its closed state. When pressed, the key will physically bounce (i.e. , it will open and close randomly) before it stabilizes in a closed position. The key will be in its depressed state for some period of time, relatively long compared to the time period of the bounce. The keypad scanner mechanism must discern depressions of the key and distinguish from bounce. Further, it is often important that the keypad scanner mechanism detect how long a key is depressed, for example, a volume control which continues to adjust by either increasing or decreasing volume as the key is held down. When the key is released, the keypad scanner mechanism must detect that the key has been released and report that information to the user. Once so released, the key will bounce again and then go to a stable state of being released, and the keypad scanner mechanism must read such activities.

Prior to the present invention, a variety of keypad reporting systems have been in use. These keypad reporting systems have exhibited certain requirements and characteristics which are restricting or limiting in certain applications, for example, for cordless telephones. The requirements and characteristics include high cost of hardware to perform the reporting function and utilization through software of significant amounts of available processing power due to the necessity that functions be performed with a single processor. It would, therefore, be an improvement in the technology if a keypad reporting system were developed which employed more simplified and thus more cost-effective hardware and which allowed for the use of real time software which utilizes a minimum amount of the available processing power thereby allowing use of a smaller, less costly microcontroller that can run at a much lower clock speed thereby limiting power consumption. The keypad scanner mechanism of the present invention provides these improvements.

One particular application for which the keypad scanner mechanism of the present invention is well-suited is a cordless telephone. Cordless telephones may be contrasted with standard telephones in several respects. The standard telephone consists of a base unit and a handset unit connected to each other by an electrical cord. The base unit itself is connected by another cord to a receptacle on a wall, telephone pole or a similar immovable structure to which the telephone network line extends. Because of this connection to an immovable structure, the range of movement of the operator of the telephone is quite limited. Even when the cords connecting the handset unit to the base unit and the base unit to the wall are long, it can be cumbersome either to move the entire telephone around to make calls from different locations or to walk around with the handset unit once a call has been placed. The simple fact that there is always a continuous physical connection between the person making the phone call and the immovable wall or other fixed structure can be a great inconvenience.

The cordless telephone, on the other hand, represents a significant improvement over the standard telephone. In the conventional cordless telephone, the base unit is still connected to the receptacle on the immovable wall or the like by a cord so that message signals from the telephone network line may be received and transmitted. However, the handset unit of the cordless telephone is an independently operative unit from which calls may be made and by which calls may be received with no physical connection to the base unit. The handset unit has a transmitting/receiving system or transceiver, a loudspeaker in an earpiece and a microphone in a mouthpiece. The base unit and the handset unit of the cordless telephone communicate with each other over a communication channel established by the transmission and reception of electromagnetic waves, conventionally radio waves. The handset unit may then be taken considerable distances from the base unit while still making and receiving telephone calls. Since there is no telephone cord extending between the handset unit and the base unit, the operator is free to move about without hindrance.

Heretofore, keypad reporting systems have been developed and used, for example, in cordless telephones, to perform various functions. As previously described, however, there are a number of aspects of such keypad reporting systems that can be improved. The present keypad scanner mechanism provides these improved aspects.

Based upon the foregoing, those skilled in the art should now perceive that the keypad scanner mechanism of the present invention, for example, for use in cordless telephones, is an improvement over the existing technology. It is a shortcoming and deficiency of the prior art that such an improvement has not previously been conceived.

SUMMARY OF THE INVENTION

To overcome the aforementioned shortcomings and deficiencies, the present invention generally provides a keypad scanner mechanism. More particularly, the present invention provides such a keypad scanner mechanism, which mechanism is designed to be installed in both the base unit and handset unit of a cordless telephone.

In one aspect, the invention is a keypad scanner mechanism including a keypad having more than one key, incorporated with an integrated circuit including a microcontroller, the keypad scanner mechanism comprising an activity detect mode for determining when at least one of the keys has been depress ed and a normal mode, triggered when at least one of the keys has been depressed during activity detect mode, for identifying and reporting to the microcontroller depression of the keys.

In another aspect, the invention includes the above-described keypad scanner mechanism wherein the integrated circuit includes a clock generator and an output is generated to the clock generator when activity is detected in the activity detect mode.

In a further aspect, the invention includes the above-described keypad scanner mechanism further comprising a status register and an interrupt, generated if at least one of the keys is depressed since the status register was last read.

In yet another aspect, the invention includes the above-described keypad scanner mechanism further comprising a means for debouncing the keys, the means operating via software.

In an even further aspect, the invention includes the above-described keypad scanner mechanism further comprising a multiple keys down code reported whenever more than one key is simultaneously depressed.

In another aspect, the invention includes the above-described keypad scanner mechanism further comprising a no keys down code reported whenever no key is depressed.

In another embodiment, the invention includes a method for scanning a keypad comprised of more than one key, the keypad being incorporated with an integrated circuit including a microcontroller, comprising the steps of detecting depression of at least one of the keys on the keypad and triggering a wake up of the integrated circuit in response to the detecting.

In another aspect, the invention includes the above-described method further comprising the steps of identifying depression of the keys after the triggering and reporting depression of the keys to the microcontroller after the triggering.

In another embodiment, the invention is the improvement in a keypad comprised of more than one key, the keypad being incorporated with an integrated circuit including a microcontroller, wherein the keypad includes a keypad scanner mechanism having an activity detect mode and a normal mode.

In another aspect, the invention includes the above-described improvement wherein the keypad is for use in a base unit and a handset unit of a cordless telephone.

BRIEF DESCRIPTION OF THE DRAWINGS

For a more complete understanding of the present invention, and for further objects and advantages thereof, reference may now be had to the following detailed description taken in conjunction with the accompanying drawings wherein.

DETAILED DESCRIPTION OF THE INVENTION

In the detailed description that follows, to facilitate understanding of the present invention, and as an example only, an embodiment of the keypad scanner mechanism of the present invention which is incorporated with an exemplary integrated circuit (IC) for use with a cordless telephone system is precisely described. It should be expressly understood that the present invention is not necessarily limited to that application, although the invention has been found to work especially well in actual practice when so used.

Further, it should also be expressly understood that a multitude of different embodiments of the present invention could be employed in the particular application described; as is typical and understood, the present invention is limited solely by the scope of the appended claims.

General—Keypad Scanner Mechanism

1. Characteristics

Figure 1:
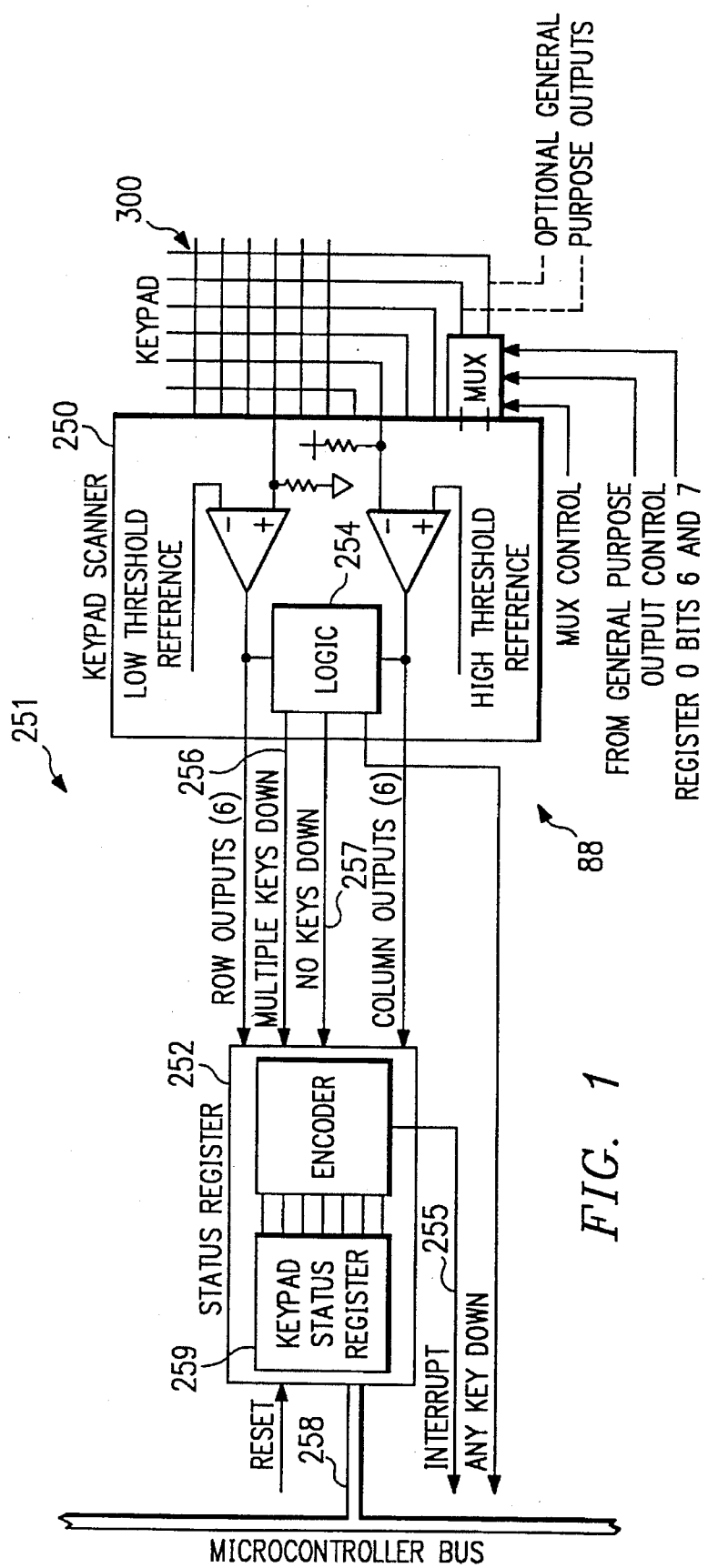
FIG. 1 is a block diagram of a keypad scanner according to the teachings of the present invention.

Referring now to the drawings wherein for convenience and clarity like or similar elements are generally referred to with the same reference numeral throughout the several views and initially to FIG. 1, there is shown a block diagram of the keypad scanner mechanism according to the teachings of the present invention. The keypad scanner mechanism 251 provides the ability to support keypads 300 of up to 36 keys. The keypad scanner mechanism 251 includes the following functions:

Wake-up—Activity (key closure only, not release) is detected without clocks, and an activity indication is generated.

Status register 252—Readable by software at any time. The current state of the keypad is reported.

Interrupts 255—A maskable interrupt is generated if the state of the keypad changes since the status register was last read.

Debouncing—Via software.

Multiple keys closure detection 256—A multiple keys down code is reported whenever more than one key is closed at a time.

No keys down indication 257—A no keys down code is reported whenever no keys are depressed.

2. Functional Overview

More specifically, the keypad scanner mechanism 251 operates in two modes: 1) activity detect, and 2) normal. In the activity detect mode, the keypad scanner mechanism 251 does not determine which key is depressed, but only when a key has been depressed. This allows the IC (not shown in FIG. 1) to wake up from shut-down mode when the user presses a key. An output is generated to the clock generator module 82 (shown in FIG. 2a) when activity is detected while the IC is in shut-down mode.

In normal mode (which is triggered once the activity is detected during the activity detect mode), the identity of the depressed key is determined and reported, for example, to an input of a microcontroller (not shown) of the IC by means, for example, of a microcontroller bus 258. Debouncing is the responsibility of the user software. An interrupt 255 is generated when activity is detected, e.g., when a key is closed. Typically, the user responds to the interrupt 255 by masking the keypad interrupt, setting a microcontroller timer (alebounce time is typically 4 to 16 milliseconds), and returning from the interrupt 255. When the timer expires an interrupt 255 is generated. This causes the user to read a keypad status register 252, which at this time contains the stable identity of the depressed key. This status includes a no keys down code (00000000), a multiple keys down code (0XXXXXX1), and codes for each of the keys (0RRRCCC0); R=row code, C=column code, and X=don't care.

3. Details

Still referring to FIG. 1, the keypad scanner mechanism 251 module is comprised of the scanner unit 250 and the keypad status register 252.

The scanner unit 250 contains row and column input pins and comparators, and a block of logic 254 that detects the no keys down, multiple keys down, and any key down conditions. Details of the scanner 250 are as follows:

| Pins | 6 with weak pull-downs (rows) |
| --- | --- |
| | 6 with weak pull-ups (columns) |
| Switch resistance | Open ≧ 150k Ohms |
| | Closed ≦ 2k Ohms |
| No keys down output | Active when the outputs of all the row comparators are low. |
| Any key down output | Active when the output of any of the row comparators is high. This signal goes to the interrupt controller module. |

The status logic 254 formats the inputs from the scanner unit 250, and presents this status to the user. More specifically, keypad status logic comprises the following:

| Inputs | 6 row comparator outputs |
| --- | --- |
| | 6 column comparator outputs |
| | No keys down output |
| | Multiple keys down output |
| | microcontroller Read strobe |
| | microcontroller data bus |
| | Register select strobe from address decoder module |
| Outputs | Register drives the internal data bus |

-continued

| | when accessed by the address decoder module. An interrupt request is generated whenever the value of the register changes. This interrupt request is connected to the interrupt controller. |
| --- | --- |
| Encoder | The six row and six column signals are encoded into two three-bit words (octal to binary encoding). This is combined with the no keys down and multiple keys down indications to form a seven-bit word. Bit 7 of the register is always 0. |

It is appropriate now to describe the various pins which are the inputs to the row comparators of the keypad scanner mechanism 251. These pins connect to the "row" side of the keypad switch matrix 300. Each input has an internal weak pull-down which is always active.

Now discussing the various pins which are inputs to the column comparators, these pins connect to the "column" side of the keypad switch matrix. Each input has an internal weak pull-up which is always active. The Column 6 and Column 5 pins are multiplexed with General Purpose Outputs 7 and 6 respectively (default=keypad mode).

The following now describes the user visible registers relevant to the keypad scanner mechanism 251. The user visible registers include the following keypad status register 259:

Address: FF2C

Size: 8 bits

Default: 00 hex

Access mode: Read only

Set by: Hardware

Cleared by: Reset

This register 259 reports the identity of any single key closure, as well as the no keys down and multiple keys down conditions. The keypad status change interrupt 255 request is generated whenever the value of the register 59 changes. The interrupt request is cleared when this register 259 is read. The following more specifically describes the status register 252:

| 7 | 6 | 5 | 4 | 3 | 2 | 1 | 0 |
| --- | --- | --- | --- | --- | --- | --- | --- |
| RSRVD | ROW BIT 2 | ROW BIT 1 | ROW BIT 0 | COL BIT 2 | COL BIT 1 | COL BIT 0 | MULTPL KEYS. DOWN |

| BIT 7 | Reserved |
| --- | --- |
| | Reads return a zero. Alternatively, if appropriate to the application, could implement a function that would result in this bit being read as a one. Software is preferably written to take this into account. |
| BITS 6–4 | Row Key Code |
| | These three bits provide a binary encoding of the key matrix row on which the key is closed. If no keys are depressed the bits are all zeros. If multiple keys are closed, the bits are undefined. |
| BITS 3–1 | Column Key Code |
| | These three bits provide a binary encoding of the key matrix column on which the key is closed. If no keys are depressed, the bits are all zeros. If multiple keys are closed, the bits are undefined. |
| BIT 0 | Multiple Keys Down |
| | This bit is set if more than one key is depressed, otherwise it is cleared. |

The IC Itself

Figure 2A:
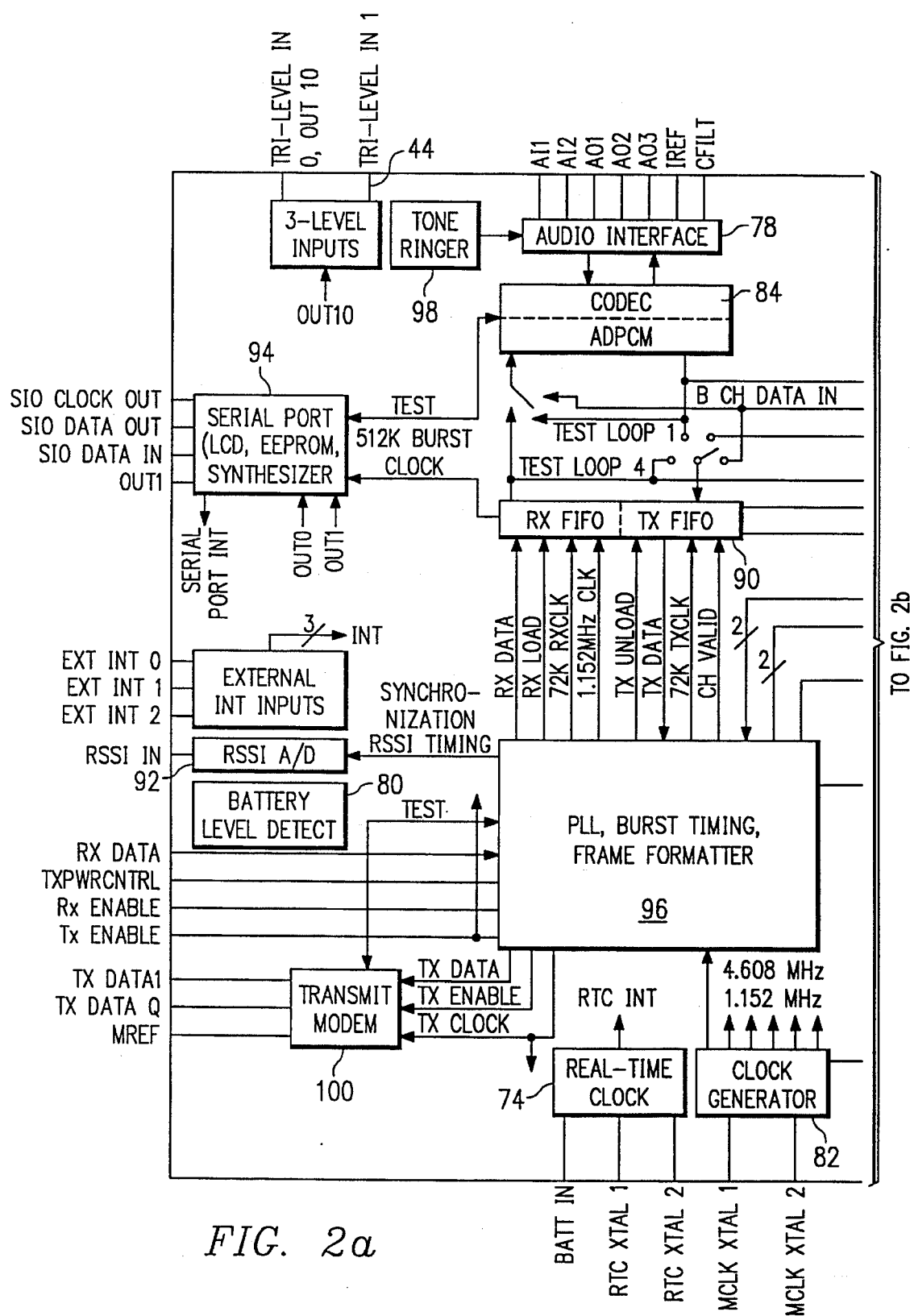
FIG. 2 (which consists of FIG. 2a and FIG. 2b) is a block diagram of an exemplary IC for use with the keypad scanner mechanism according to the teachings of the present invention.
Figure 2B:
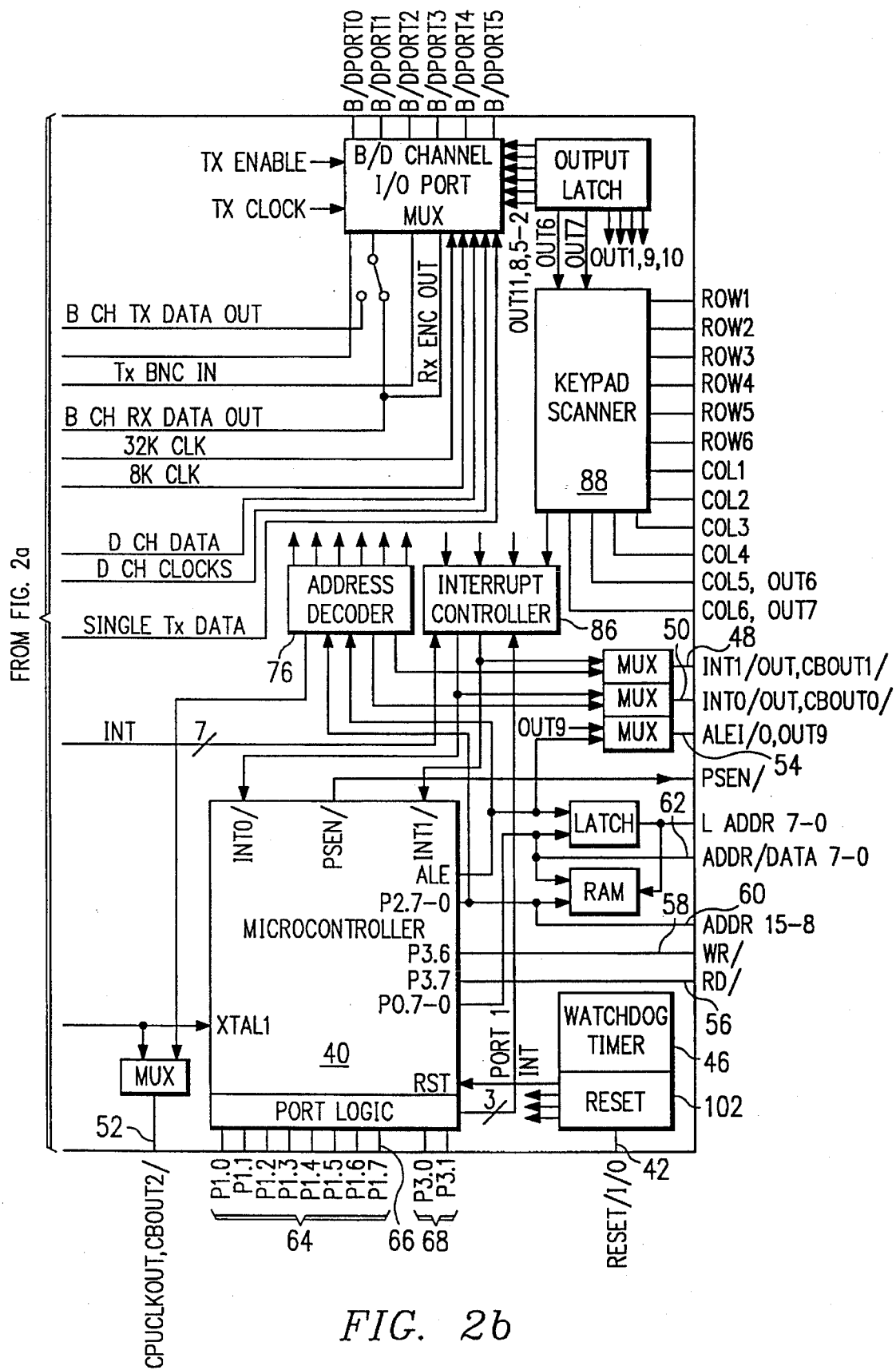

Referring now to FIG. 2 (comprised of FIGS. 2a and 2b), pertinent elements of an exemplary IC for use with the keypad scanner mechanism will be discussed hereinbelow. The exemplary IC includes an 8-bit microcontroller providing the function of the 8OC32T2 member of the 8OC51 family of Advanced Micro Devices (AMD) products, which microcontroller will also be discussed herein to the extent as may be relevant to a particular embodiment of the keypad scanner mechanism for use with the exemplary IC.

Operating Modes

Generally describing the IC shown in FIG. 2, it may be noted initially that the IC has three basic modes of operation. Those three modes are an in-circuit emulation mode, a normal mode, and a test mode. The in-circuit emulation capability mode is the subject of the present invention.

Generally, the in-circuit emulation capability mode disables the on-chip microcontroller (designated by reference numeral 40 in FIG. 2), allowing an external ICE to be used for software development and software and hardware debugging. The normal mode is the mode in which the product containing the IC is operated by the end user. A final mode of operation, the test mode, is basically the same as the normal mode, except that in the test mode it is possible to also enable internal test functions of the IC.

Entry into the three operating modes is controlled by the state of the reset pin 42 and the tri-level IN1 (TRI1) pin 44. Although those pins 42, 44 could effect such selection in a number of different ways, one way would be to have the state of the TRI1 pin be monitored and acted upon by the IC when the reset pin 42 goes inactive. If the TRI 1 is low, for example, the incircuit emulation capability mode could be activated. At a mid supply or no-connect point, the test mode could be activated. Finally, when the TRI 1 pin is high and, again, when the reset pin 42 goes inactive, the IC could operate in the normal mode.

In this exemplary IC, the in-circuit emulation capability mode is triggered at reset if, when the reset pin 42 goes high, the tri-level input 1 pin 44 is low. Further, all interval connections to I/O ports of the exemplary IC are routed from the microcontroller (i.e., "off-chip"), with the exception of the clock connected to the timer 0 and timer 1 inputs (this clock can be external to the IC). ALE and PSEN/then become inputs. The clock input to the microcontroller, which is routed off chip, is forced on at reset in in-circuit emulation capability mode. The watchdog timer 46 does not operate in this mode.

When the IC shown in FIG. 2 (which IC, it should be noted, depicts an exemplary embodiment of the present invention) is placed in the in-circuit emulation capability mode, a number of pins shown in FIG. 2 change function. Specifically, in the in-circuit emulation capability mode, the following pins change function as described below:

| PIN | USE IN ICE MODE |
|---|---|
| INT0/OUT, CSOUT0/ | INT0/OUT |
| INT1/OUT, CSOUT1/ | INT1/OUT |
| CPUCLKOUT, CSOUT2/ | CPUCLKOUT |
| ALE I/O, OUT9 | ALE INPUT |
| RD/ | RD/ INPUT |
| WR/ | WR/ INPUT |
| ADDR15-8 | ADDR15-8 INPUTS |
| ADDR/DATA7-0 | ADDR/DATA7-0 - ADDRESSES = INPUTS DATA I/O = O/I |
| P1.6-0 | HIGH-Z |
| P1.7 | INPUT |
| P3.1-0 | HIGH-Z |

Registers

Figure 3:
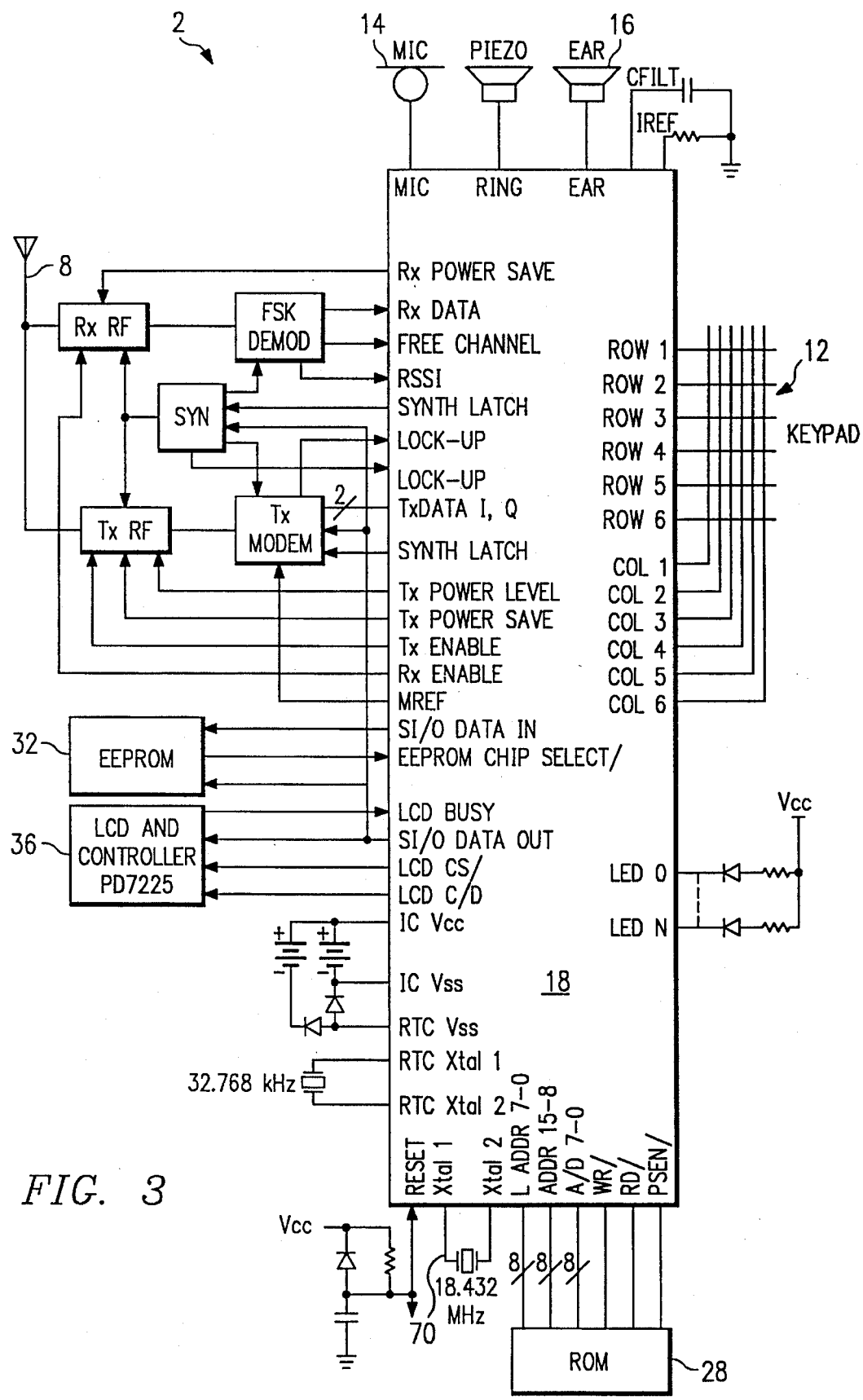
FIG. 3 is a block diagram of a handset unit of a cordless telephone into which an exemplary IC for use with the keypad scanner mechanism according to the teachings of the present invention has been installed.

Because of the level of sophistication of those skilled in the art and the degree of detail shown in FIGS. 2–4, no attempt will be made herein to precisely describe the functions of each pin and register within the exemplary IC shown. Such a description is simply not necessary for those skilled in the relevant art to obtain a full understanding of all of the inventive aspects of the present invention. Further, reference may be had to the various related applications for further specifics about these and other aspects.

System Control—Requirements

Certain aspects of the IC system control relevant to the keypad scanner mechanism are, however, described hereinbelow. For further details than those given herein of system control requirements and other system matters of the IC, reference may be had to the various related applications.

In the exemplary IC shown in FIG. 2 (which IC, as previously stated, is exemplary of the type IC with which the present keypad scanner mechanism may be incorporated), the PSEN/pin assumes a high impedance state when the in-circuit emulation capability mode of the IC is triggered.

As part of a functional view of the system control, it is appropriate now to discuss I/O port utilization and effects thereon of the in-circuit emulation capability mode. Accordingly, each of the four I/O ports used in the exemplary IC in which the present invention may be included is discussed immediately below.

With regard to Port 0, it is used in connection with multiplexed address/data bus bits 7–0.

Port 1 is used for general I/O lines. These lines are mapped to specific control functions by software. The Port 1 I/O lines contain a weak pull-up. During emulation mode, the weak pull-ups are disabled and the port pins assume a high impedance state.

Port 2 is used for address lines 15–18. The Port 2 I/O lines contain a weak pull-up. Disabling the weak pull-up is accomplished by setting a corresponding port control register bit (PCRB) to an appropriate value. After RESET, the Port 2 weak pull -ups are enabled. During emulation mode, the weak pull-ups are disabled and the port pins assume a high impedance state.

With regard now to Port 3, P3.0, P3.1, P3.2, P3.3, P3.4, P3.5, P3.6, and P3.7 need to be discussed.

P3.0 is used as either the microcontroller serial port receive data input (R/D) or as a general purpose I/O pin. P3.1 is used as either the microcontroller serial port transmit data output (T×D) or as a general purpose I/O pin. P3.2 is used internally as an interrupt input from the internal interrupt controller (INT0/). P3.3 is used internally as an interrupt input from the internal interrupt controller (INT1/). P3.4 is used as the internal timer 0 clock input. This pin is not available external to the IC. P3.5 is used as the internal timer 1 clock input. This pin is not available external to the IC. P3.6 is the WR/strobe for the address/data bus. P3.7 is the RD/strobe for the address/data bus. The Port 3 I/O lines contain a weak pull-up. Disabling the weak pull-up is accomplished by setting a corresponding port control register bit (PCRB) to an appropriate value. After RESET, the Port 3 weak pull -ups are enabled. During emulation mode, the weak pull-ups are disabled and the port pins assume a high impedance state.

Discussing now I/O buffer configuration, in the exemplary IC with which an embodiment of the present invention may be incorporated, the Port 1, 2, and 3 I/O buffers are capable of disabling the weak p-channel pull-up through software control. The necessity of this function permits the buffers to eliminate current sourcing when the buffer is driven low by an external signal. This weak pull-up disabling feature of the exemplary IC eliminates undesirable power consumption increases. The AMD 8OC32T2 lacks such a mechanism. After reset, all of the Port 1, 2, and 3 I/O buffers are held "high" by the weak pull-up. This state is functionally compatible with the 8OC32T2 microcontroller. To disable the weak pull-up, the software must first disable each bit by configuring the port pin with the corresponding port control register bit. The corresponding port control register bit resides at the same address as the port SFR bit. For example, Port 1 resides at SFR memory location 90H. The Port 1 control register also resides at SFR memory location 90H. Modification of the Port 1 Control Register is only accomplished when the PCRA bit in the PCFIG SFR is set to a "1". When the PCRA bit is cleared, an operation to the Port SFR address results in the Port SFR getting updated.

Since only Ports 1, 2 and 3 contain weak pull-ups, Port 0 is exempt from this feature.

The following table describes the different combinations of the port setup in the exemplary IC.

| PCRB | PORT | BIT FUNCTION |
|------|------|--------------|
| 0 | 0 | Drives a "0" output, no pull-up (80C51 compatible) |
| 0 | 1 | Drives a "1" for 2 cycles, weak pull-up is on. (80C51 compatible) |
| 1 | 0 | Drives a "0" output, no pull-up |
| 1 | 1 | Input only, (no pull-up, high impedance input) |

Upon power-up, the PCRA bit is disabled and any writes to the ports result in the port SFR being updated. Once the PCRA bit in the PCFIG register is set, it becomes possible for each port bit to have the weak pchannel device turned off. After each port bit is appropriately configured, the user must clear the PCRA bit before writing to the ports.

If the user turns on the weak p-channel device after it is disabled, the port pin may not return to a "1" immediately. This condition is similar to the 80C51 when an external device drives the input signal low and then allows the pin to "float" back to a "1". This rise time of the signal is dependent on the loading of the pin and may take several microseconds to return to a stable "1".

Discussing now the interface to on-chip peripheral bus in the exemplary IC presented as an example of the type of IC in which the present invention may be incorporated, all user visible registers and on-chip RAM reside on an internal version of the microcontroller address/data bus. In order to reduce power consumption, this bus does not change state during accesses to program memory space. When the IC is in an in-circuit emulation mode, this power saving feature is not available, and the on-chip peripheral bus will transition during accesses to program memory space.

Discussing now on-chip RAM in the exemplary IC, such an IC having an 8OC32T2 microcontroller has 256 bytes of RAM located in the "Internal Data RAM" space. 1024 bytes of additional "on-chip" RAM is located in "External Data RAM" space. All of the 1024 bytes of on-chip RAM is backed up by the real-time clock's back-up battery. The backed up RAM can support read and write accesses down to 2.2 Volts. The backed up RAM can retain data down to 1.8 Volts.

Discussing now interrupt enable during shut-down in the exemplary IC, if the IC is in a shut-down mode and the microcontroller is in an idle mode, the condition of the microcontroller's interrupt mask bits (TCON register bits 7, 2, and 0) is ignored, enabling the INT0/ and INT1/interrupts. The actual TCON bits are not changed to safeguard against the IC entering a shut-down mode with interrupts disabled.

It should also be noted that in the exemplary IC, anytime that the CPUCLK speed is programmed to be less than 9.216 MHz the length of the PSEN pulse is shortened by one cycle of CPUCLK (that is, the falling edge is delayed by one CPUCLK cycle). This reduces the power consumed by the external memory devices when the CPUCLK is slowed down.

Figure 5:
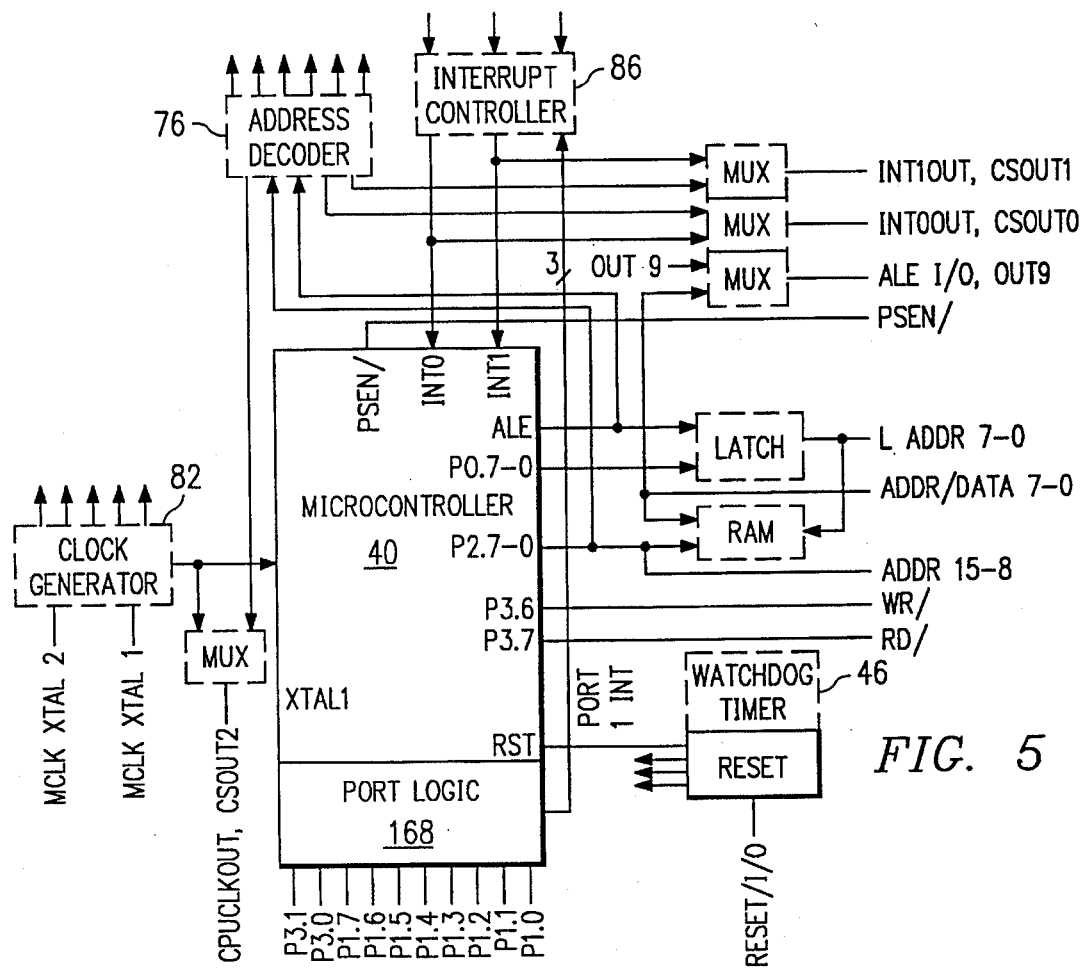
FIG. 5 is a block diagram of a microcontroller system that may form part of an exemplary IC for use with the keypad scanner mechanism according to the teachings of the present invention.

Those skilled in the art should take note with reference to FIG. 5 that the ALE I/O pin is multiplexed with the general output bit 9. The INT0/OUT and INT1/OUT pins are multiplexed with the external I/O 0 and external RAM chip select outputs, respectively, from the address decoder module 76. During the in-circuit emulation mode, these pins always provide the ALE-OUT, INT0/, and INT1/OUTPUT functions. During normal operation, the ALE pin can be either ALE OUT or general output 9. Selection is programmed in the address decoder module. The INT0/ and INT1/pins are always used as chip select outputs in normal operation.

Those skilled in the art should take further note with reference to FIG. 5 that a demultiplexed form of the 8OC32T2's address bus is constructed by latching the low-order address byte, providing the LATCHED ADDRESS 7–0 pins. The address is latched off of the A/D 7-0 bus on the falling edge of ALE. In the exemplary IC, internal timing accounts for the delays associated with bringing A/D 7–0 and ALE on chip when the exemplary IC is in in-circuit emulation mode.

Figure 4:
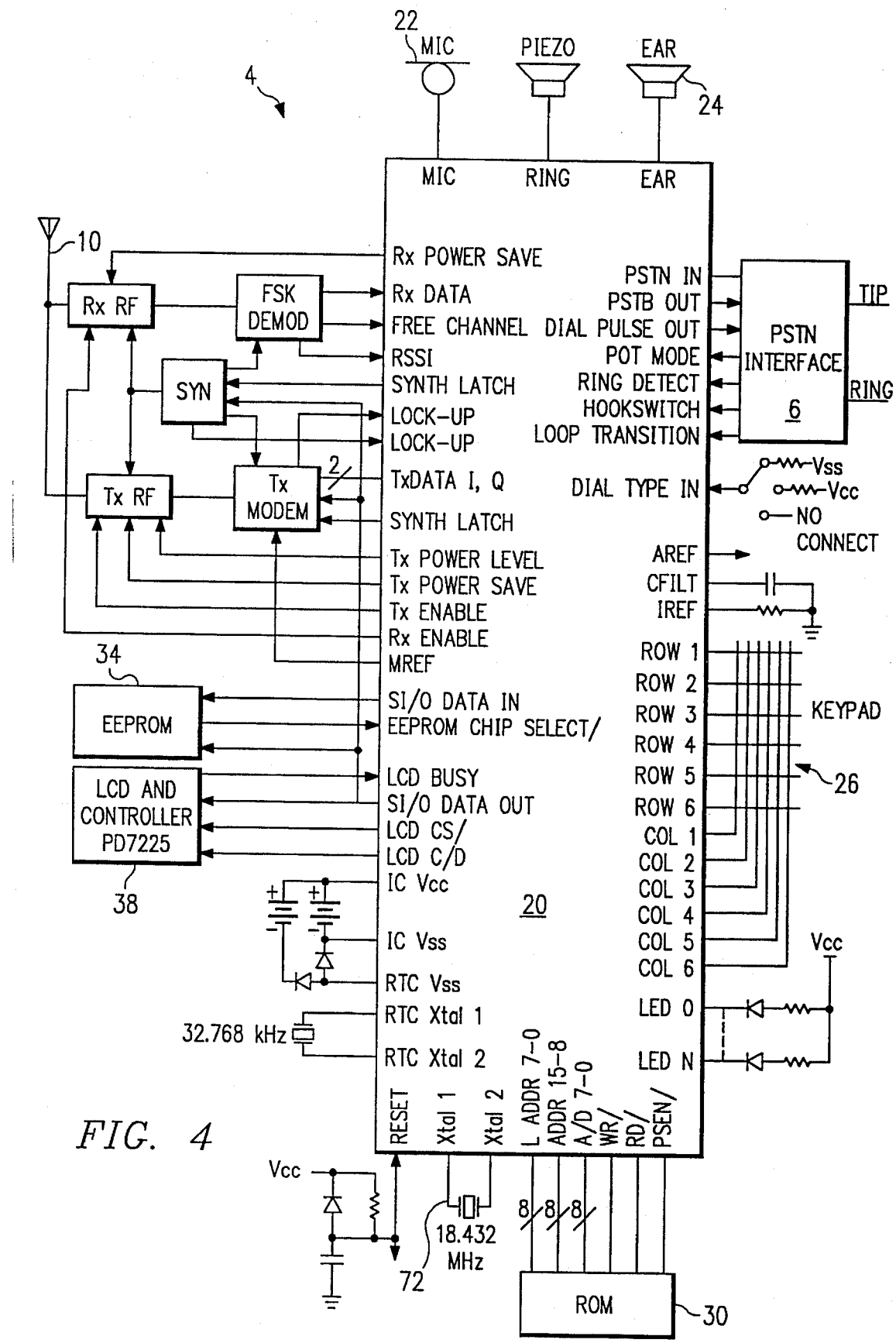
FIG. 4 is a block diagram of a base unit of a cordless telephone into which an exemplary IC for use with the keypad scanner mechanism according to the teachings of the present invention has been installed.

To facilitate a complete understanding of the microcontroller shown in FIG. 4 and its role in the IC of the exemplary IC with which the keypad scanner mechanism of the present invention may be used, a brief discussion of each pin shown therein follows.

P0. 7–P0. 0 is the microcontroller I/O port 0. This port provides the multiplexed D7–0 and A7–0 bus. When the exemplary IC is in reset the pins are held weakly high. In shut-down, the pins will either be held strongly low or weakly high. In in-circuit emulation mode the pins are high impedance.

P1.7–P1.0 is the microcontroller I/O port 1. This port provides the eight general purpose I/O pins associated with the parallel port module. When the IC is in reset the pins are held weakly high. In shut-down, the pins hold their programmed state. In in-circuit emulation mode the pins are high impedance.

P2.7–P2.0 is the microcontroller I/O port 2. This port provides the high order eight bits of the address bus (A15-8). When the IC is in reset or shut-down, the pins are held weakly high. In in-circuit emulation mode the pins are high impedance.

P3.7 is the microcontroller I/O port 3.7. This pin provides the microcontroller RD/ (read, active low) strobe. In in-circuit emulation mode the pin is high impedance. In shut-down or during reset the pin is held weakly high.

P3.6 is the microcontroller I/O port 3.6. This pin provides the microcontroller WR/ (write, active low) strobe. In in-circuit emulation mode the pin is high impedance. In shut-down or during reset the pin is held weakly high.

P3.1 is the microcontroller I/O port 3.1. This pin provides the microcontroller's internal serial port transmit data output. The pin can also be used as a general purpose I/O port. In in-circuit emulation mode the pin is high impedance. In reset the pin is held weakly high. In shut-down the pin holds its programmed state.

P3.0 is the microcontroller I/O port 3.0. This pin provides the microcontroller's internal serial port receive data input. The pin can also be used as a general purpose I/O port. In in-circuit emulation mode the pin is high impedance. In reset the pin is held weakly high. In shut-down the pin holds its programmed state.

PSEN/ is the program store enable. When active, the address on ports 0 and 2 pertains to code space. PSEN/ is placed in a high impedance state in in-circuit emulation mode, and is an output in normal mode. In reset, PSEN/ is held weakly high. In shut-down the pin is held strongly high.

ALE is the address latch enable. This signal is used to latch the address off of the A/D 7–0 bus. ALE is high impedance during in-circuit emulation mode. ALE is an output, multiplexed with OUT9 during normal mode. In shut-down or reset the pin is held strongly high.

LATCHED ADDRESS 7–0 is the output of the address latch, providing the non-multiplexed LA7–0 bus. At reset, shut-down, and in in-circuit emulation mode these pins are driven strongly.

System Control—Clock Generator

The clock generator 82 (see FIG. 2a) provides the crystal oscillator, power mode control, module enable control, and clock dividers for the exemplary IC.

When the IC is placed in shut-down mode the 18.432 MHz oscillator (e.g., oscillator 72 in FIG. 4) and all clocks derived from it are stopped. All modules are disabled except the real-time clock 74. All analog pins are placed in their off state, that is, the same state as when the IC is in reset.

The IC is placed into shut-down mode by setting a bit in a shut-down/microcontroller clock control register. After the bit is set the oscillator 72 continues to run for 3.56–7.12 milliseconds in order for software to place itself in its idle mode, then all clocks, including the CPUCLK are stopped. In the exemplary IC, the IC terminates the shut-down cycle if an interrupt is received after the enable bit is set, and before the CPU clock is stopped.

Continuing to discuss the exemplary IC, access to the shut-down/microcontroller clock control register is protected by an interlock mechanism to reduce the risk of accidental clock stoppage due to software problems. This mechanism requires the software to write to a special access control register, and then write the shut-down/microcontroller clock control register. This double-write procedure must be done twice before the clock speed control register is updated.

Wake-up comes from reset, an any-key-down indication from the keypad scanner 88, the real-time clock interrupt (if not masked within the real-time clock 74), or any non-masked interrupt. When the IC leaves shut-down mode the oscillator is re-started. A delay of approximately 3.56 milliseconds is required for the oscillator to stabilize. After this delay, the microcontroller 44 and watchdog timer 46 clocks are re-started. The microcontroller clock re-starts at the previously programmed rate.

When the IC is in shut-down, the keypad any-key-down and real-time clock interrupts are enabled, even if the associated interrupt enable bits are cleared, i.e., even if the interrupts are disabled. The actual interrupt enable bits are not changed. Also, it should be noted that the real-time clock interrupts can still be masked within the real-time clock module 74 in the exemplary IC.

The microcontroller clock in the exemplary IC has a programmable divider with an input of 18.432 MHz. The programmable rates are divided by 2, 4, 8, 16, 32, 64, 128, and 256. When the IC leaves the shut-down mode, the CPU clock returns to the speed programmed in the control register. The CPUCLK can be turned off by placing the IC in shut-down mode.

When the clock speed is changed, the transition to the new frequency is accomplished without producing clock pulses that violate the 8OC32T2, or other such appropriate product, data sheet timing specifications.

The microcontroller clock also has a selectable automatic speed-up mode. If the automatic speed-up option is selected, all interrupts force the microcontroller clock divider to the divide by two state. After the clock is sped-up, it will remain at the divided by two frequency until the speed is reprogrammed to a lower value. No illegally short pulses are allowed at the frequency transition point.

Once the command is issued by the microcontroller to enter shut-down, the processor clock continues to run for between 3.56 and 7.12 milliseconds before being stopped.

The clocks to each module are provided by the clock generator module 82. Control bits are provided to allow software to turn on and off specific modules. When a module is turned off, its clock is stopped and held low.

The serial port 94 supports data rates of 288 kHz, 144 kHz, and 36 kHz. The clock provided to the serial port module is divided down to the desired data rate by the clock generator module 82. The clock speed is selected via the serial port timing control register. The serial port module and this clock are enabled via a module enable control register 0. When the module is disabled, the clock is stopped low.

Figure 6:
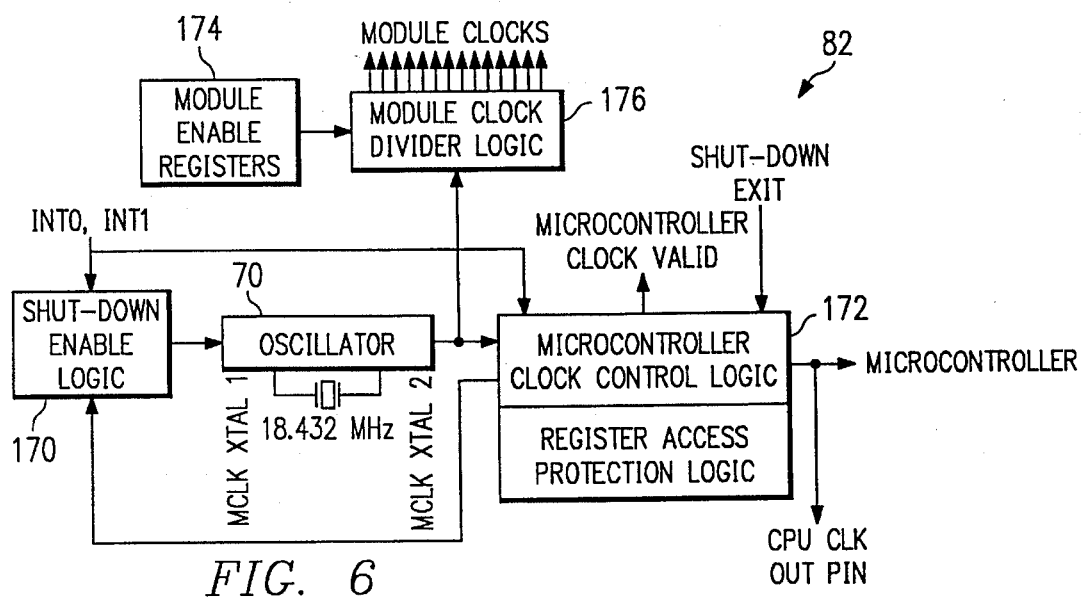
FIG. 6 is a block diagram of a clock generator module that may form part of an exemplary IC for use with the keypad scanner mechanism according to the teachings of the present invention.

FIG. 6 is a block diagram of the clock generator module of the exemplary IC. As may be seen in FIG. 6, the clock generator module directly or indirectly comprises the oscillator 70, shut-down mode control logic 170, microcontroller clock control logic 172, module enables 174, and a module clock divider 176. Each of these is described further in an individual paragraph immediately below.

The oscillator 70 is designed to run at 18.432 MHz, using a parallel resonant mode crystal. Start-up capacitors are required; however, the exemplary IC minimizes capacitance value to save power.

The shut-down mode/microcontroller clock control logic 170, 172 controls the entry into shut-down, microcontroller clock frequency, and automatic speed-up.

With respect to the module enables 174, register bits to turn on and off specific modules within the IC are located in the clock generator module 82. These bits also stop the clock outputs to their respective modules.

The module clock divider logic 176 is a divider chain that produces the clock frequencies required by each module.

The clock generator module 82 has three pins. Pin MCLK XTAL is the master clock crystal pin 1. This pin is for input and is on the input side of the oscillator 70. The oscillator 70 is designed to work with either a parallel resonant crystal or an external logic level input. The MCLK XTAL 2 pin is the master clock crystal pin 2. This pin is for output and is on the output side of the oscillator 70. If a crystal is used, this pin is connected to the crystal. If an external logic level signal is used, this pin is left unconnected. The CPUCLK-OUT pin is connected to the same clock that feeds the microcontroller 40. It is an output that can be routed off chip. In in-circuit emulation mode, the CPUCLKOUT is always active. When the IC is not in incircuit emulation mode, this clock is multiplexed with the CSOUT2/ signal from the parallel I/O port module. The multiplexer control is located in the address decoder module 76 (see FIG. 2b). In reset, this pin defaults to the CSOUT2/ function, and is held high. At shut-down, if the pin is programmed for CPUCLK operation it is held low.

The clock controller module 82 of the exemplary IC contains the following programmable registers: a shut-down/microcontroller clock control register; a shut-down/ microcontroller clock access; a protection register; a module enable control register 1; a module enable control register 2; and a serial port timing control register.

System Control—Address Decoder

The addresses of all internal registers as well as the on-chip RAM and the three external chip selects of the exemplary IC are decoded by the address decoder module 76. Enable signals are generated when internal registers or internal RAM is accessed by the microcontroller. Chip selects outputs are generated when external RAM space or either of the two external I/0 spaces are accessed.

The address decoder module 76 of the exemplary IC includes a CSOUT0/pin, a CSOUT1/pin and a CSOUT2/ pin. The CSOUT0/pin carries a signal which is multiplexed with the INT0/OUT signal. This pin also provides the chip select function when the IC is not in in-circuit emulation mode. The CSOUT0/signal is active (low) when a MOVX instruction is executed to the external I/O space. In reset or shut-down this pin is held high. The CSOUT1/pin carries a signal which is multiplexed with the INT1/OUT signal. This pin also provides the chip select function when the IC is not in in-circuit emulation mode. The CSOUT1/ signal is active (low) when a MOVX instruction is executed to the external RAM space. In reset or shut-down this pin is held high. The CSOUT2/pin carries a signal which is multiplexed with the CPUCLKOUT signal. This pin also provides the chip select function when the IC is not in in-circuit emulation mode and the CSOUT2/ enable bit is set in a chip select control register. The CSOUT2/signal is active (low) when a MOVX instruction is executed to the external I/O 2 space. In reset, this pin is held high. If the pin is programmed for CSOUT2/ mode, it is held high in shut-down.

The aforementioned chip select control register is the only user visible register in the address decoder module 76.

It may also be noted that the decoder module 76 of the exemplary IC includes an address latch and an associated pin. The address latch provides the latched form of the low order eight address bits (LADDR 7–0). The latched address bus (LADDR 7–0) pins are outputs when the IC is in normal, shut-down, or in-circuit emulation modes. When the IC is in shut-down, the pins are driven strongly with the last value before entering shut-down. The outputs change on the falling edge of ALE.

System Control—Interrupt Controller

The interrupt controller 86 of the exemplary IC gathers interrupt requests from various sources internal and external to the I C and generates an interrupt to the microcontroller 40 (INT0/ and INT1/).

The interrupt system employed in the exemplary IC in which an embodiment of the keypad scanner mechanism capability mode of the present invention may be incorporated has a multilevel structure, including interrupt causes and status registers, a local mask, a local interrupt source register, a main interrupt mask register, and a main interrupt source register. Each of these elements is discussed further in an individual paragraph immediately below.

With regard to interrupt causes and status registers, the causes of the interrupts form the lowest level, and are local to each module. These causes can be inputs to pins, conditions such as empty or full data buffers, and the like. The causes are reported in "status registers". A status register, when read by software, always returns the current state of cause signal (for example, the current logic level on an input pin). The bits in a status register are not affected by interrupt masking.

Discussing now the local mask, the cause signals are ANDed with associated mask signals from an "interrupt mask register". The output of these AND gates connect to a "local interrupt source register". The mask register is located in the module that contains the associated cause signals.

The local interrupt source register is used by software to determine the cause of an interrupt. The bits in the interrupt source register can be set by either rising edge, falling edge, or both edges of the non-masked cause signal. The bits in interrupt source registers are cleared separately from each other. In general, each bit is cleared when software responds to the cause. This response can be reading a receive buffer, reading an input port status register, or the like. The outputs of each of the register bits is ORed together to produce one interrupt request signal. This signal is sent to the interrupt controller module. The source register is located in the module that contains the associated cause signals.

With respect to the main interrupt mask register, the interrupt request signals are ANDed with associated mask signals from the "main interrupt mask register" (located in the interrupt controller module 86). The output of these AND gates connect to a "main local interrupt source register".

The main interrupt source register is used by software to determine the cause of an interrupt. The bits in the interrupt source register reflect the logic level of the interrupt request signals, provided they are not masked. In general, each interrupt request is cleared when software responds to the specific interrupt cause. The outputs of the main interrupt source register are ORed together and forwarded to the microcontroller.

Figure 7:
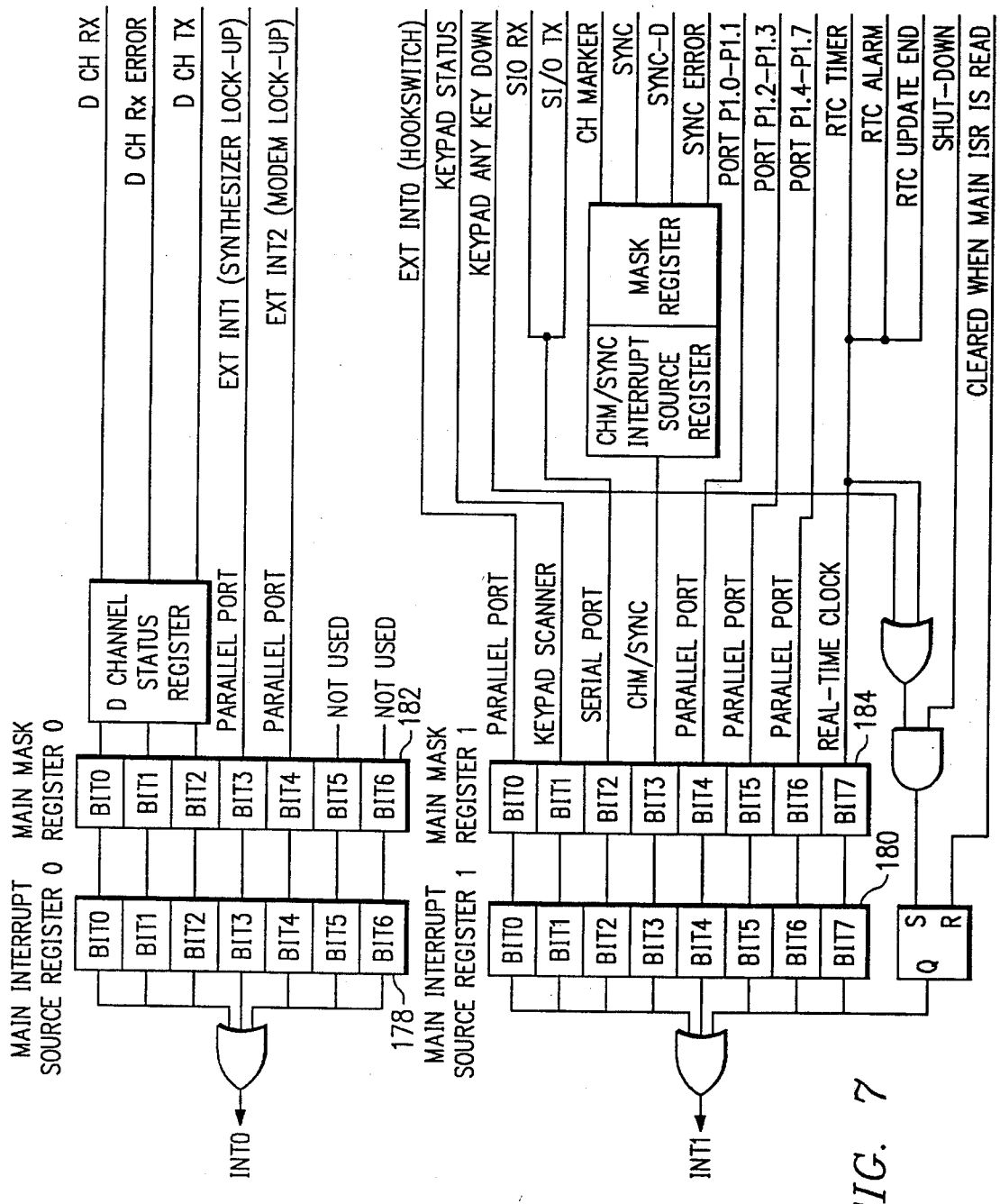
FIG. 7 is a possible structure for an interrupt controller that may form part of an exemplary IC for use with the keypad scanner mechanism according to the teachings of the present invention.

FIG. 7 shows the structure of the interrupt controller 86 of the exemplary IC. Interrupt requests from the logic module 96 (see FIG. 2a), external interrupt inputs (such as hook-switch/lock-ups), the serial I/O 94, the parallel I/O (see FIG. 1 and the accompanying discussion), keypad scanner 88, and the real-time clock 74 modules feed the two main interrupt source registers 178, 180. A master interrupt mask function is provided in the microcontroller in the form of a main mask register 0 182, and a main mask register 1 184.

By way of example only, set forth immediately below is a list of interrupt causes in the exemplary IC employed in a cordless telephone application.

| INTERRUPT CAUSE | SET/CLEARED |
| --- | --- |
| D channel receive | SET: Receive buffer contains 6 bytes of data CLEARED: When receive buffer is read |
| D channel receive error | SET: Error detected in received D channel data CLEARED: D Channel Status Register is read |
| D channel transmit | SET: Transmit buffer empty CLEARED: When transmit buffer is loaded |
| SI/O receive | SET: Receive buffer full CLEARED: Reading receive buffer |
| SI/O transmit | SET: Transmit buffer empty CLEARED: When transmit buffer is loaded |

| INTERRUPT CAUSE | SET/CLEARED |
| --- | --- |
| RTC timer | SET: Timer bit set (and not masked) in RTC Source Register<br>CLEARED: Reading RTC Source Register |
| RTC alarm | SET: Alarm bit set (and not masked) in RTC Source Register<br>CLEARED: Reading RTC Source Register |
| RTC update end | SET: Update end bit set (and not masked) in RTC Source Register<br>CLEARED: Reading RTC Source Register |
| PI/O P1.0–P1.1 | SET: Programmed edge of non-masked port 1 pin<br>CLEARED: Reading PI/O Interrupt Source Register 0 |
| PI/O P1.2–P1.3 | SET: Programmed edge of non-masked port 1 pin<br>CLEARED: Reading PI/O Interrupt Source Register 1 |
| PI/O P1.4–P1.7 | SET: Programmed edge of non-masked port 1 pin<br>CLEARED: Reading PI/O Interrupt Source Register 2 |
| Keypad status | SET: Change in Keypad Status Register<br>CLEARED: Reading Keypad Status Register |
| Keypad and key down | SET: Key closure when IC is in shut-down mode<br>CLEARED: Reading Main Interrupt Source Register 1 |
| External interrupt inputs 1, 2, and 3 | SET: Any transition of the external interrupt input pins (normally used for hookswitch, synthesizer lockup, and modulator lock-up<br>CLEARED: Reading the indicated External Interrupt Status Register (one register for each input) |
| CHM | SET: Rising edge of CHM signal<br>CLEARED: Reading CHM/Sync Source Register |
| SYNC | SET: Rising edge of sync signal<br>CLEARED: Reading CHM/Sync Source Register |
| SYNC-D | SET: Rising edge of sync-D signal<br>CLEARED: Reading CHM/Sync Source Register |
| Sync error | SET: Rising edge of sync error signal<br>CLEARED: Reading CHM/Sync Source Register |

Figure 8:
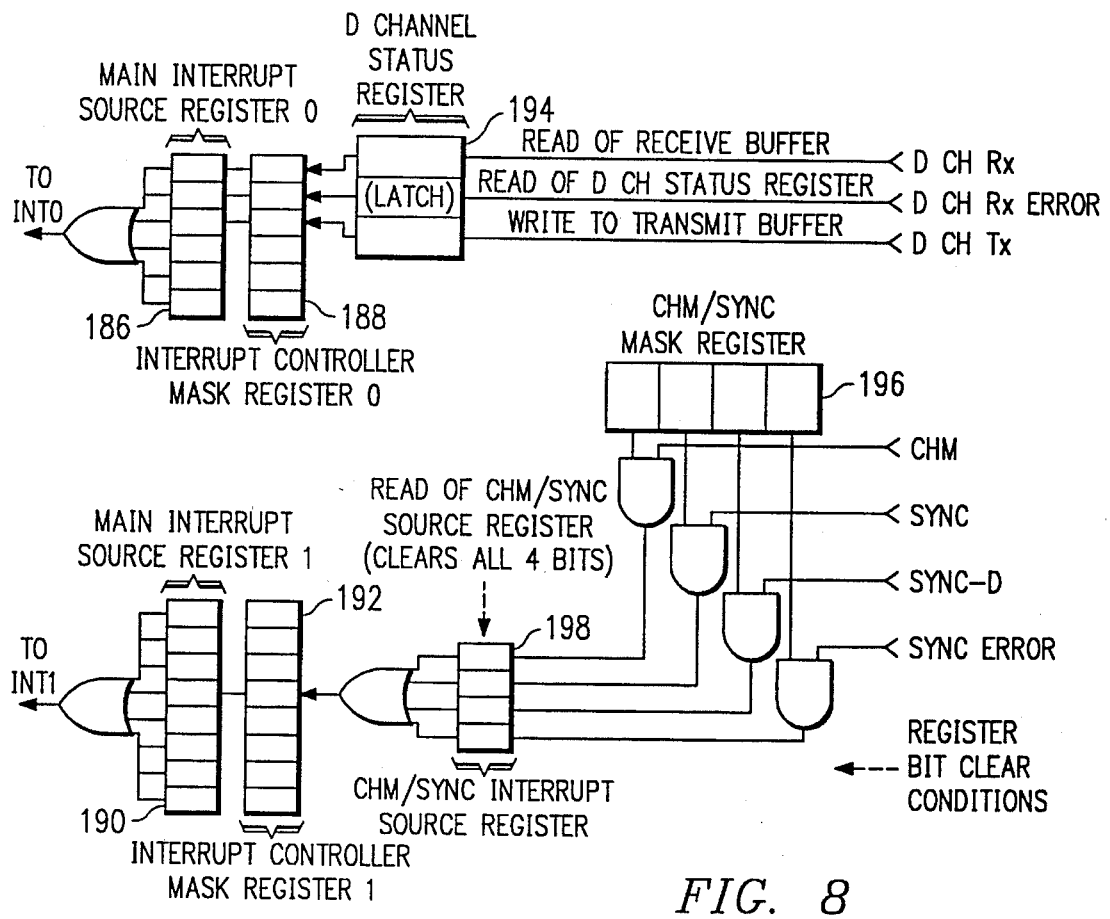
FIG. 8 shows a possible structure of the status, mask, and source registers necessary to handle interrupt cause signals from a logic module in an exemplary IC for use with the keypad scanner mechanism according to the teachings of the present invention.
Figure 9:
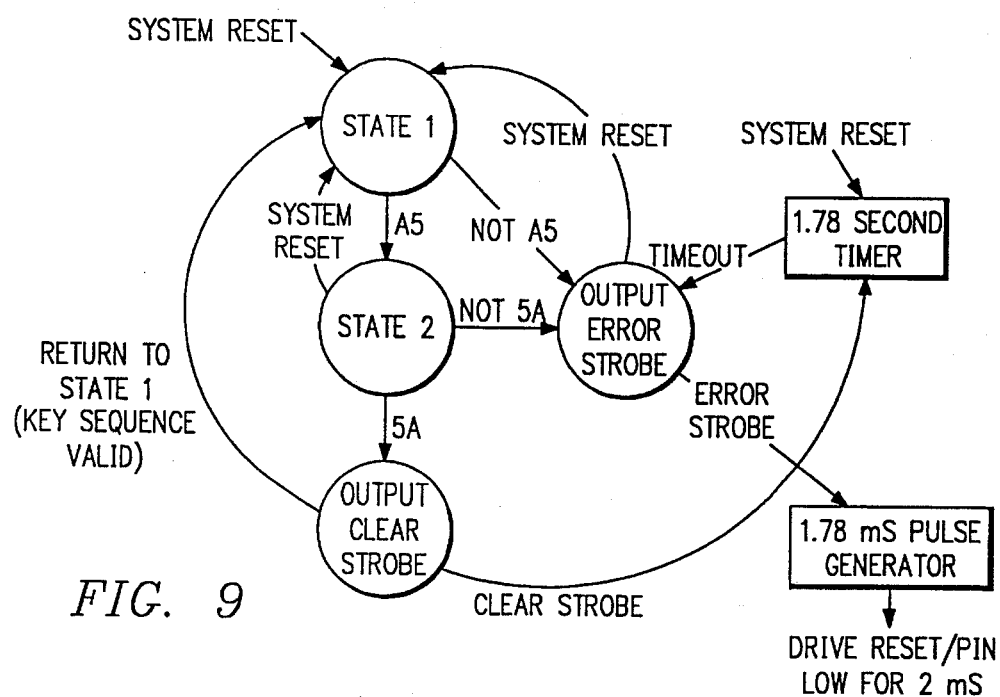
FIG. 9 shows a state diagram of a watchdog timer and a reset output mechanism that may form part of an exemplary IC for use with the keypad scanner mechanism according to the teachings of the present invention.
Figure 10:
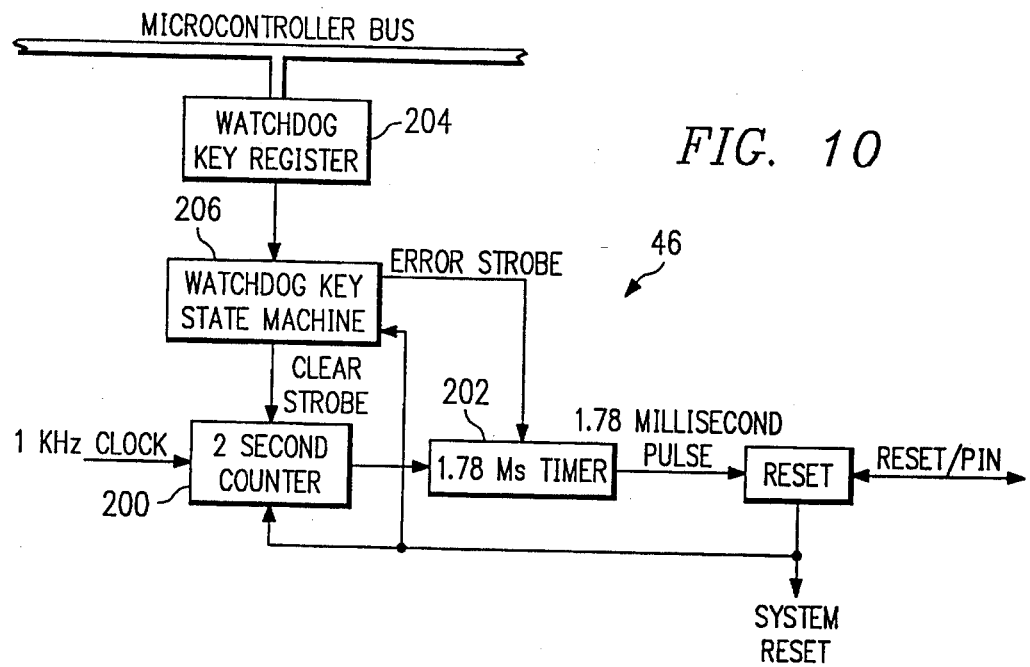
FIG. 10 shows a possible organization of a watchdog timer that may form part of an exemplary IC for use with the keypad scanner mechanism according to the teachings of the present invention.

FIG. 8 shows the structure of the status, mask, and source registers necessary to handle interrupt cause signals from the logic module 96.

The interrupt controller module 86 of the exemplary IC is comprised of seven user-accessible registers: a main interrupt source register 0 186; a main interrupt mask register 0 188; a main interrupt source register 1 190; a main interrupt mask register 1 192; a D-channel status register 194; a CHM/SYNC mask register 196; and a CHM/SYNC interrupt source register 198.

The interrupt controller 86 includes an INT0/OUT pin, and an INT1/OUT pin. The INT0/OUT signal is an output from the interrupt controller 86 to the microcontroller 40. It is routed off-chip via the INT0/OUT pins. It is used only in in-circuit emulation mode. When the IC is not in in-circuit emulation mode, this pin is used for the chip select zero (CSOUT0) output. The INT1/OUT pin carries a signal which is an output from the interrupt controller 86 to the microcontroller 40. It is routed off-chip via the INT1/OUT pin. It is used only in in-circuit emulation mode. When the IC is not in in-circuit emulation mode, this pin is used for the chip select one (CSOUT1) output.

User accessible registers in the interrupt controller module include the main interrupt source register 0 186; the main interrupt source register 1 190; the main interrupt mask register 0 188; the main interrupt mask register 1 192; the D channel status register; the CHM/Sync interrupt source register 198; and the CHM/Sync mask register 196.

System Control—Watchdog Timer/Reset

The watchdog timer 46 detects if the microcontroller software becomes hung-up or lost, and generates a hardware reset to the IC as well as the rest of the system. The watchdog timer 46 is not operational in shut-down or in-circuit emulation modes.

System Control—Parallel Port

The parallel I/O port of the exemplary IC consists of the microcontroller port 1 interrupt structure, a 11-bit general purpose output latch, 2 tri-level input pins, and three external interrupt inputs. The R×D and T×D pins in microcontroller port 3 can also operate as general purpose I/O ports. These ports are organized as discussed immediately below.

With respect to the microcontroller port P1.0–P1. 7, maskable interrupts are programmably generated on one edge of each pin. In the exemplary IC, for interrupt reporting purposes, the pins are divided into three separate interrupt source registers, one for P1. 7–4, one for P1. 3–2, and one for P1. 1–0.

The general purpose outputs, of which there are 11, are programmed via the general purpose outputs registers 0 and 1. The outputs all default high.

The two tri-level input single pins can report three input states, high, low, or open. Typical applications are dial type selection and factory test mode selection. Additionally, as discussed in considerable detail above, TRI-LEVEL IN1 is used to select in-circuit emulation mode.

With respect to the external interrupt inputs, three input pins are provided that generate interrupt requests on both rising and falling edges. These pins can be used for hookswitch, channel synthesizer lock-up, and modem synthesizer lock-up inputs.

Figure 11:
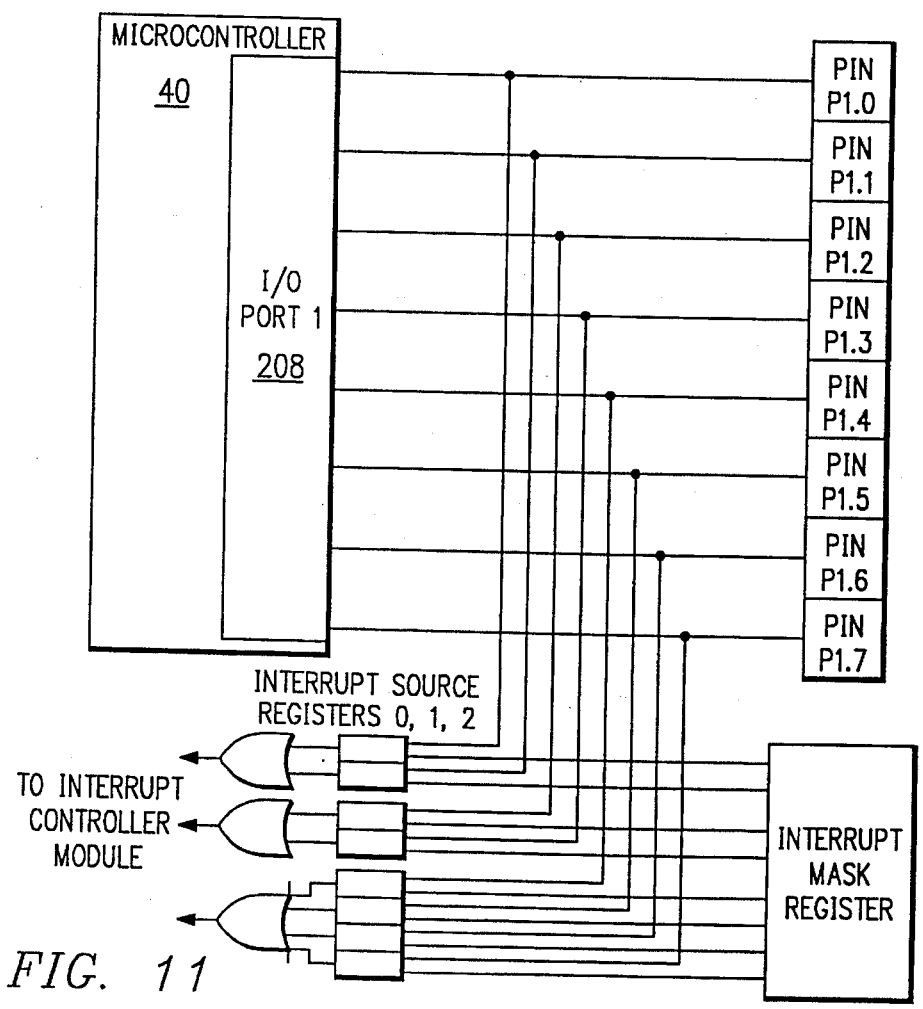
FIG. 11 shows a possible basic structure of an interrupt function mechanism that may form part of an exemplary IC for use with the keypad scanner mechanism according to the teachings of the present invention.

Functionally, all eight of the port 1 pins, when programmed as inputs, can generate maskable interrupts on edge transitions. The interrupt function is implemented in hardware separate from the microcontroller. FIG. 11 shows the basic structure of the interrupt function of the exemplary IC.

Referring to FIG. 11, the output latch of the exemplary IC provides 11 general purpose output pins for controlling external functions. This is a simple pair of registers (one 7-bit and one 4-bit) residing on the microcontroller data bus. When a bit is set in one of the registers (by software), the corresponding output pin is also set. When the bit is cleared, the pin is cleared. All pins that provide one of the general purpose outputs as their default state, default to a high level.

The multiplexing control for all pins except the keypad (OUT 6, 7) and tri-level input (OUT 10) is located in the module where their other function originates, not in the parallel port module (designated by reference numeral 208 in FIG. 11). The keypad and tri-level multiplexing is controlled in general purpose output register 1.

When the parallel I/O port is disabled, via a module enable control register 0 located in the clock generator module 82, all pins that are operating as general purpose outputs are placed in a high impedance state.

Continuing to refer to FIG. 11, two pins are provided in the exemplary IC that can detect three distinct input states: high, low, and open, or no connect. The state of the input is reported in an external interrupt status register. These pins do not generate interrupt requests. The TRI-LEVEL IN1 pin is used primarily for selecting the operating mode of the IC after the RESET pin goes inactive. The TRI-LEVEL IN1 pin can be used as a general input in slight variations of the exemplary IC, but extreme care should be taken since a reset could cause the IC to enter the in-circuit emulation mode.

Referring still further to FIG. 11, three interrupt inputs are provided in the exemplary IC that generate interrupt requests on both rising and falling transitions. The status of each input pin is reported in a separate one-bit register. If a pin changes state since the last time its status register was read or reset, an interrupt request is latched and sent to the interrupt controller module. Reading the source register clears the latch and thus the interrupt request.

In general, in FIG. 11, it may be seen that the 11 outputs of the exemplary IC are independently controlled by their respective bits in the general purpose output control registers 0 and 1. Further, the input pins are pulled to mid-supply (Vcc/2) by pull-up and pull-down resistors when read. The pins each feed a separate pair of comparators. One is biased to produce a high at its output if the input is high, and one is biased to produce a high at its output if the input is low. If the input is open, both comparators output a low state. Still further, it may be noted that the pin logic should be designed to disable the pull-up and pull-down resistors when the state of the pin is not being evaluated. This is a power saving feature. The maximum resistance of the external input with respect to Vcc or Vss is 50 Ohms (when the input is high or low). The maximum capacitance is 50 pF.

Figure 12:
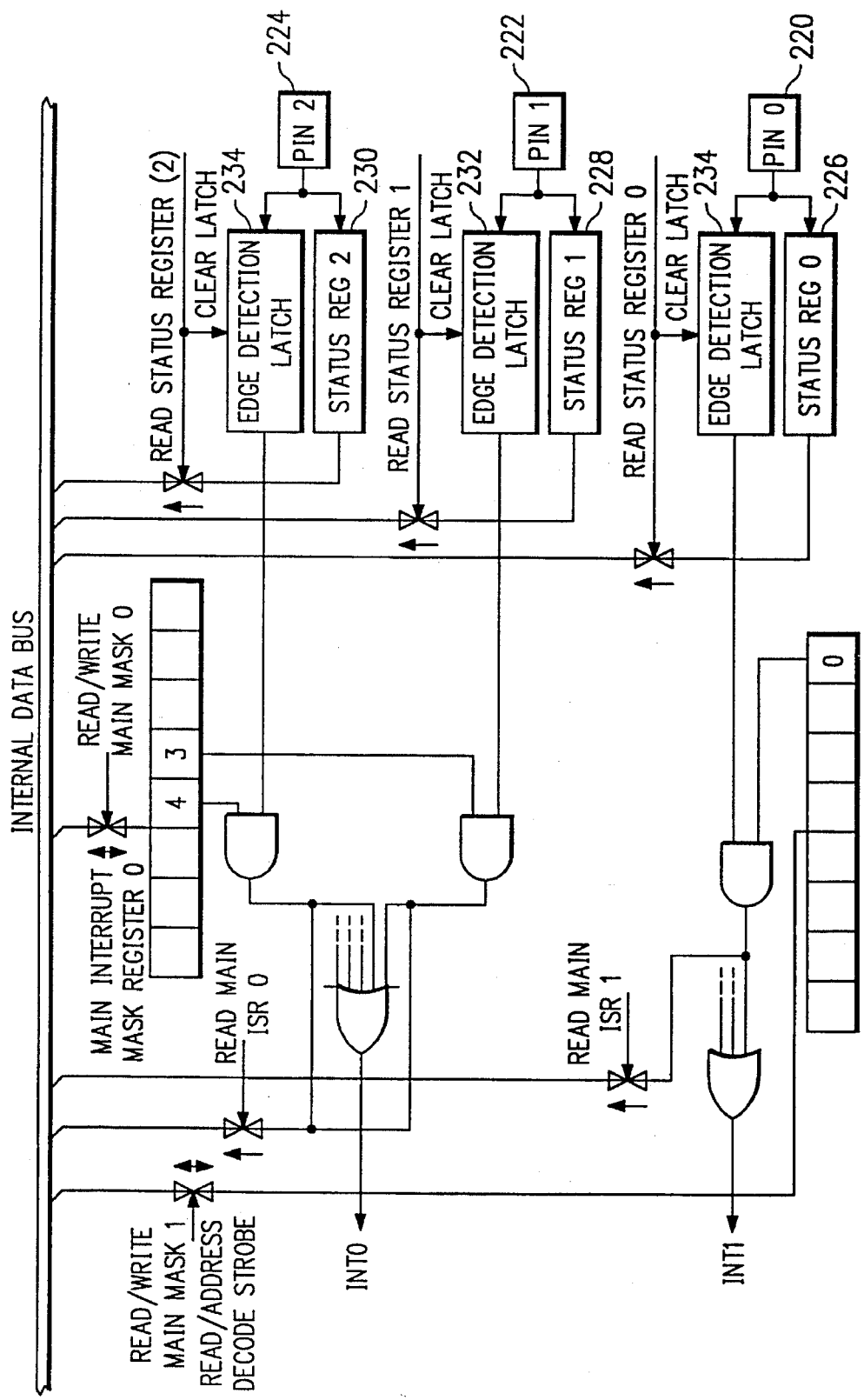
FIG. 12 shows an external interrupt input structure that may be present in an exemplary IC for use with the keypad scanner mechanism of the present invention.
Figure 13:
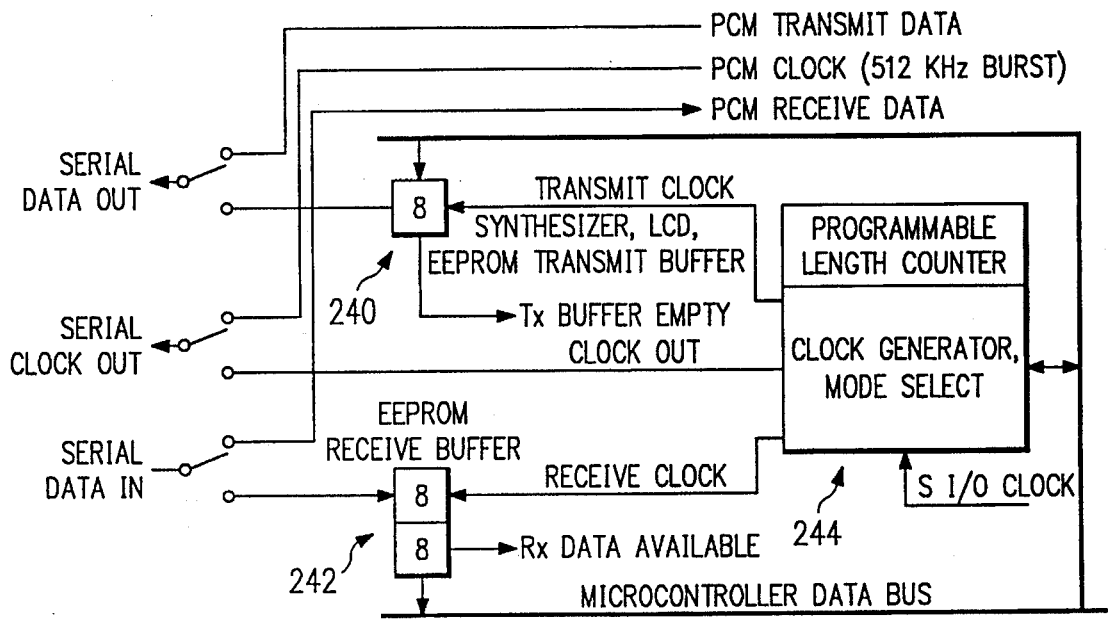
FIG. 13 shows a block diagram of a serial interface that may be present in an exemplary IC for use with the keypad scanner mechanism of the present invention.

Referring now to FIG. 12, there is shown a more detailed view of the external interrupt input structure of the exemplary IC with which the keypad scanner mechanism of the present invention may be included. It may be seen therein that this structure comprises three input pins 220, 222, 224, three status registers 226, 228, 230, and three transition detector latches 232, 234, 236.

The three external interrupt input status registers 226, 228, 230, which are one-bit registers, report the current status of the external interrupt input pins 220, 222, 224. The status bit changes as the pins change. Reading one of the registers clears the associated transition detector latch 232, 234, 236. The output of each latch 232, 234, 236 is fed to the interrupt controller module 86 where it is ANDed with an enable bit.

System Control—Serial Port

The serial interface of the exemplary IC is a combination of four serial channels. In the exemplary IC, these channels provide communication with frequency synthesizers, an LCD controller, an EEPROM, and a PCM codec test equipment. A combined set of transmit, receive, and clock logic is used to support the synthesizer, LCD, EEPROM, and PCM interfaces (see FIG. 12 wherein the transmit, receive and clock logic are generally designated by reference numerals 240, 242 and 246, respectively). This combined set of hardware is referred to as the SI/O interface.

With respect to the constructed synthesizer interface of the exemplary IC, it may be noted that communication between the IC and a synthesizer chip, e.g., an MB1501 synthesizer chip, is unidirectional. Communication goes only from the IC to the synthesizer.

With respect to the LCD interface of the exemplary IC, a serial interface is provided for communicating between the on-chip microcontroller and an NEC PD7225 LCD controller IC, or the like. This is also a one direction interface, with communication going only from the IC to the LCD controller.

The EEPROM interface of the exemplary IC is bidirectional, and is compatible with 8- and 16-bit devices that support the National, General Instruments, Exel interface. Additionally, support for devices that output data on the falling edge of the clock is required. Thus, for compatibility with a wide variety of devices, the port can be programmed to receive data on the rising or falling edge.

With respect to the PCM test port of the exemplary IC, two special modes can be invoked from software that will convert the serial port to a codec or ADPCM trans coder test port. IN codec test mode, the Data In pin becomes the 64 kbps codec receive input, the Data Out pin becomes the 64 kbps codec transmit output, and the Clock pin becomes a gated 512 kHz PCM data clock output (bursts of eight cycles at the 8 kHz frame rate). In ADPCM test mode the Data In pin becomes the 64 kbps ADPCM transmit input (PCM data :.nput), the Data Out pin becomes the 64 kbps ADPCM receive output (PCM data output), and the Clock pin becomes the 512 kHz PCM data clock output (eight bit bursts at the 8 kHz frame rate). The B/D channel port provides the 8 kHz frame sync clock. The 64 kHz data clock must be synchronized to the 8 kHz frame sync.

The PCM test port of the exemplary IC does not use the serial I/O port's transmit buffer, receive buffer, or clock generator. The audio path logic provides the clock and a serial transmit bit stream, and receives the receive data in serial form. In other words, the PCM test function uses the serial I/O port pins, but the logic to support clock generation, clock synchronization, serial to parallel, and parallel conversion is handled within the audio path logic.

System Control—Real-Time Clock

A real-time clock is provided on the exemplary IC. This clock 74 (see FIG. 2a) operates from the normal IC supply while the IC is powered on, and from a dedicated battery when the IC is powered down. A 32.768 kHz crystal is connected to the real-time clock. Additionally, a 1k byte block of RAM is provided. This "on-chip" RAM is independent from the real-time clock except that it is powered from the real-time clock's BATT IN pin.

Figure 14:
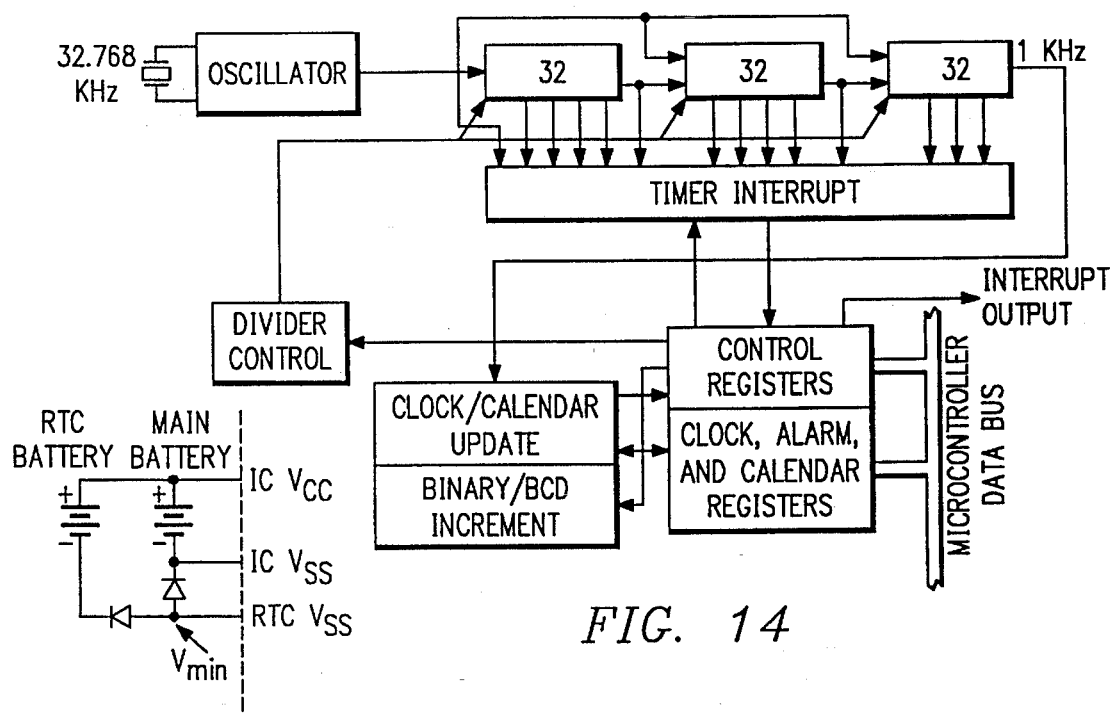
FIG. 14 is a block diagram of a real-time clock module that may form part of an exemplary IC for use with the keypad scanner mechanism according to the teachings of the present invention.
Figure 15:
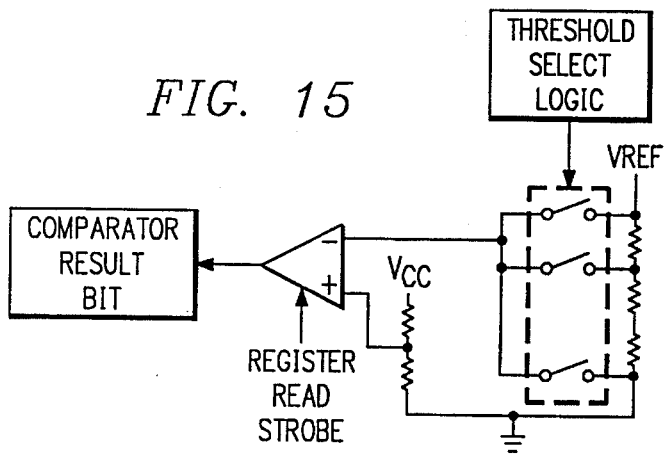
FIG. 15 is a block diagram of a battery level detector that may form part of an exemplary IC for use with the keypad scanner mechanism according to the teachings of the present invention.

FIG. 14 shows a block diagram of the real-time clock module 74 of the exemplary IC.

System Control—Battery Lvel Detector

The exemplary IC includes a mechanism providing a digital representation of the power supply (i.e., battery) voltage level over a range of 2.7 to 5.5 volts.

Functionally, the battery voltage monitor circuit compares the voltage on a Vcc pin to an internal threshold voltage. If Vcc is above the threshold voltage, the comparator output is high. If Vcc is below the threshold, the comparator output is low. In the exemplary IC, the internal threshold voltage is programmable via a 4-bit code from 2.7 Volts to 5.4 Volts, with an accuracy of ±5%.

Figure 17:
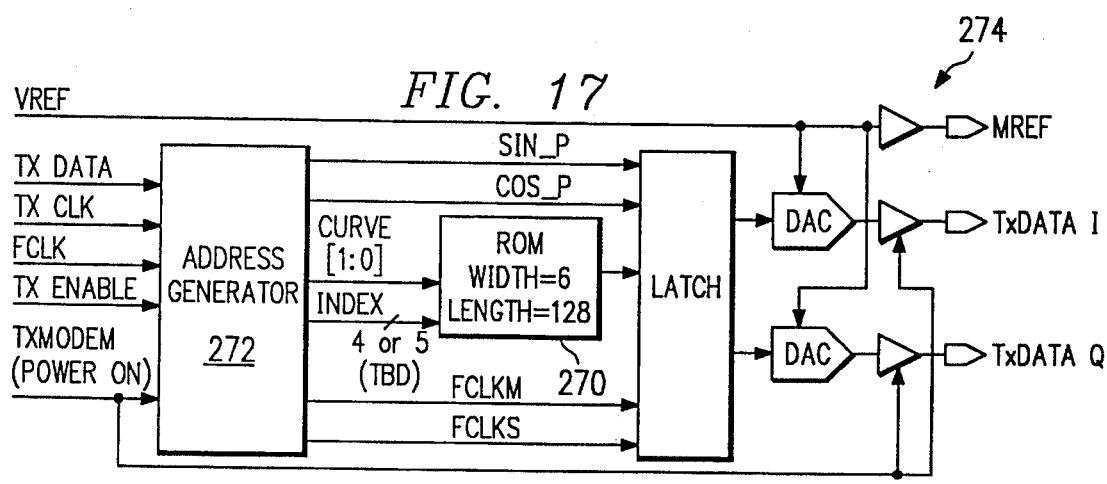
FIG. 17 is a block diagram of a transmit modulator that may form part of an exemplary IC for use with the keypad scanner mechanism according to the teachings of the present invention.

FIG. 17 is a block diagram of the battery level detector module of the exemplary IC.

CT2

The CT2 portion of an exemplary IC which incorporates the in-circuit emulation capability mode of the present invention may include the following modules: FIFOs 90, a B/D Channel Port (see FIG. 2b), a transmit modem 100, an RSSI A/D Converter 92, and a logic module 96.

Figure 16:
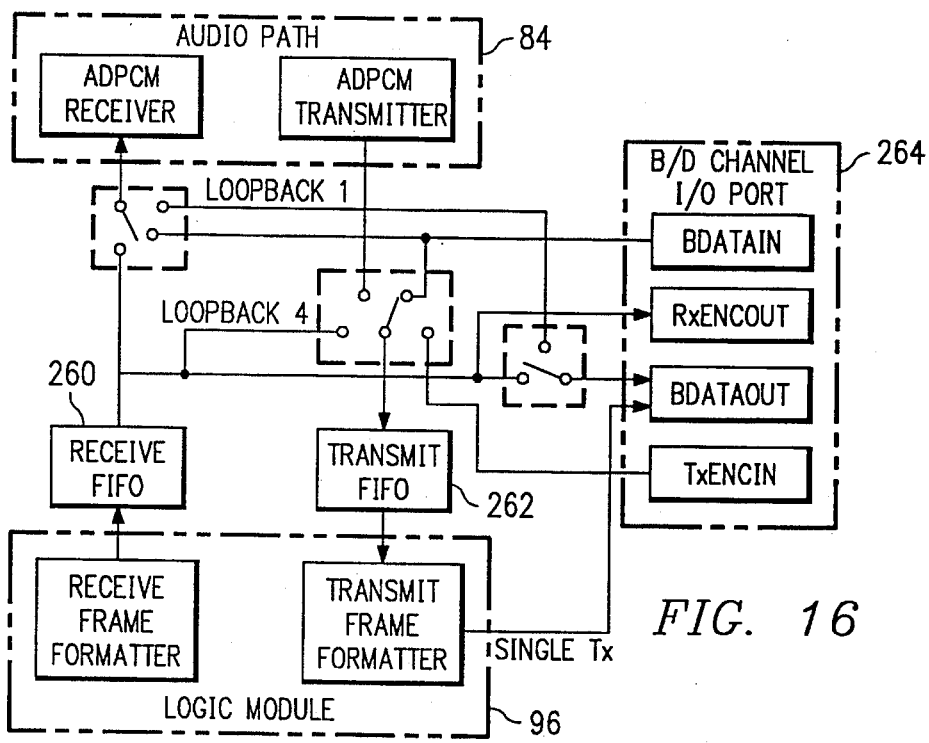
FIG. 16 shows various CT2 modules that may form part of an exemplary IC for use with the keypad scanner mechanism according to the teachings of the present invention.

In the exemplary IC, two unidirectional FIFOs 260, 262 are provided between the ADPCM block 84, the B channel I/O 264, and the frame formatter 96, with one in the transmit direction and one in the receive direction 262 (see FIG. 16). These FIFOs provide an elastic store between the 72 kbps radio burst rate and the constant 32 kbps ADPCM, B channel port rate. The FIFOs appear to be serial when viewed from the frame formatter 96, and 4 bits wide when viewed by the ADPCM block 84 because the ADPCM operates on nibbles.

The FIFO module 90 in the exemplary IC builds 512 kHz, 32 kHz, and 8 kHz clocks from either a 1.152 MHz clock from the logic module 96, (specifically, a PLL1152) or a fixed 1.152 MHz clock from the clock generator module 82.

The B/D Channel I/O Port module 264 in the exemplary IC provides six I/O pins that are multiplexed to serve four separate functions: a B channel I/O port, including encryption; a D channel I/O port; a single transmit (Tx Modulator I/O); and six general purpose output ports.

The transmit modulator 100 of the exemplary IC accepts serial data from the CT2 logic module 96 and converts it to a quadrature pair of single-ended analog outputs. The outputs generated in the exemplary IC are intended to be externally mixed with an IF carrier and summed to obtain the desired frequency modulated signal.

A block diagram of the modulator 100 is shown in FIG. 17. The heart of the modulator 100 is a look-up ROM 270 addressed by a data dependent state machine address generator 272 and followed by a series of synchronizing latches 274. Two identical 6-bit+sign DAC's followed by buffers drive the analog outputs.

As discussed in much greater detail in various of the related applications, a test mode may be provided in the exemplary IC to simplify spectral measurements.

The receive signal strength indication (RSSI) module 92 provides a digital representation of the RF receive signal level.

Discussing now generally the logic module 96, a frame controller is provided which comprises a receive timing recovery, a frame timing generator, a SYNC channel handler, a B channel handler, a D channel handler, and a modem timing adjustment.

Figure 18:
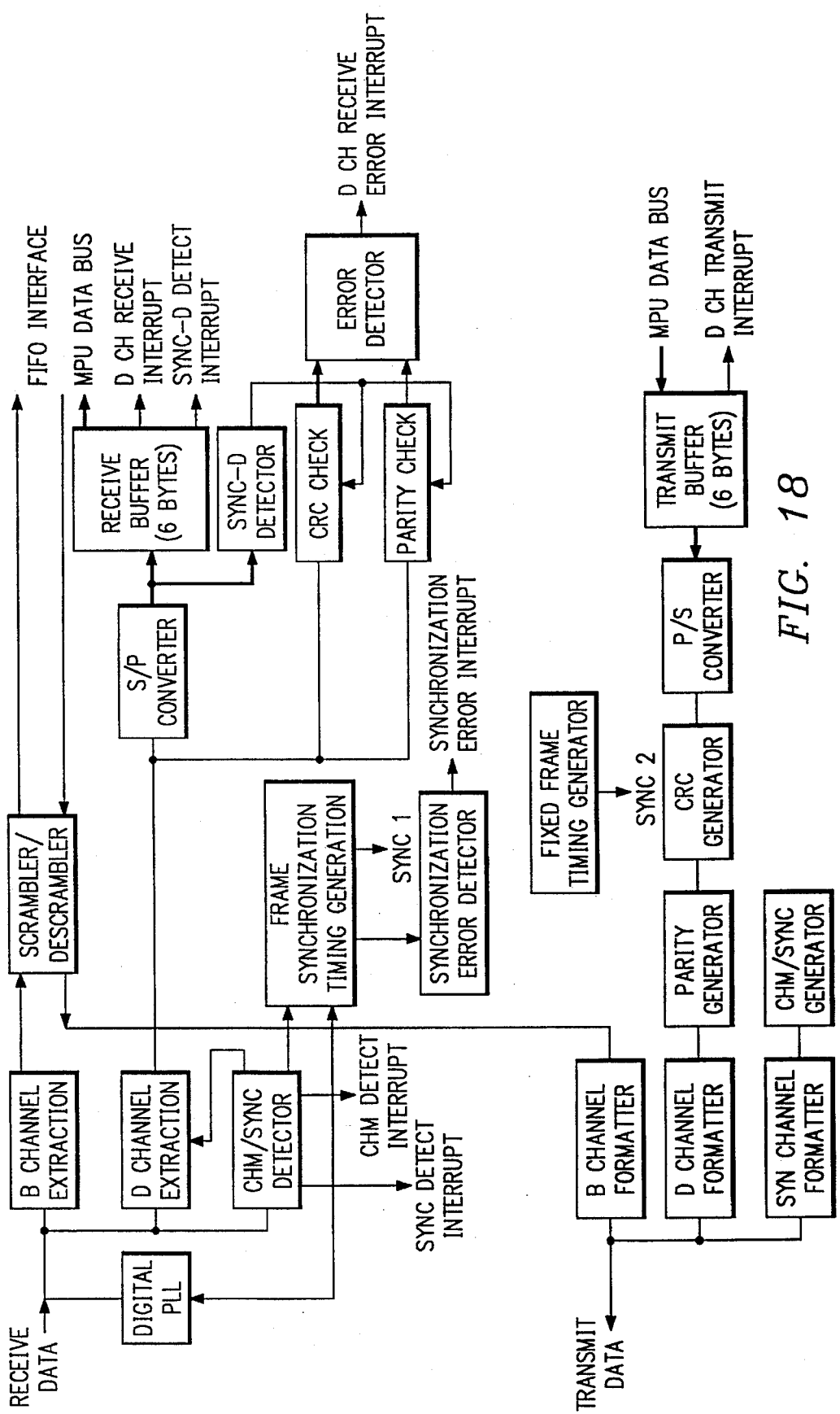
FIG. 18 is a block diagram of a frame controller that may form part of an exemplary IC for use with the keypad scanner mechanism according to the teachings of the present invention.

FIG. 18 is a block diagram of the frame controller, including the receive timing recovery, frame timing generator, SYNC channel handler, B channel handler, D channel handler.

With regard to the receive timing recovery function, bit synchronized timing from the receive data (Rx Data) is generated and fed to the various functions.

The SYN channel handler receives a burst signal and the PLLed clock from the receive clock generator (DPLL) and it gives received sync information to the frame timing generator and the CPU. It also receives transmit timing pulses from the frame timing generator, transmit data from the B channel handler and the D channel handler and it generates a transmit burst signal.

The frame timing generator receives received synchronization information from the syn channel handler when the system is receiving a signal, gives all the necessary receive and transmit timing pulses to the B channel handler, the D channel handler, the SYN channel handler of the transmit portions, MODEM timing adjustment, and any other blocks where those pulses are required.

The modem timing adjustment measures the delay of the modem and the RF section when they are transmitting and receiving a reference signal from the modem.

Cordless Telephone Application

Figure 19:
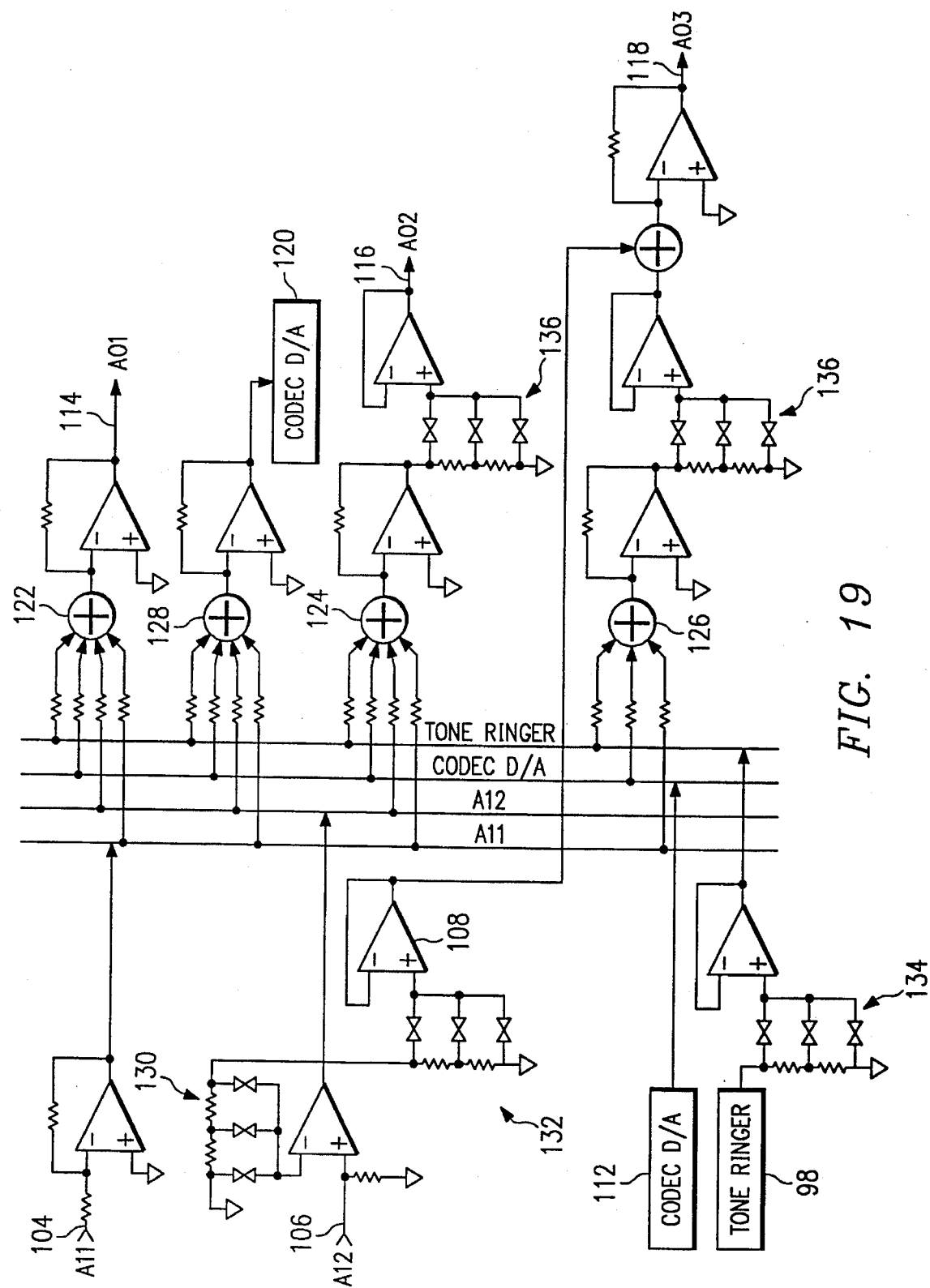
FIG. 19 is a block diagram of an audio interface of a cordless telephone into which the exemplary IC's have been incorporated (hereinafter, "a cordless telephone")
Figure 20:
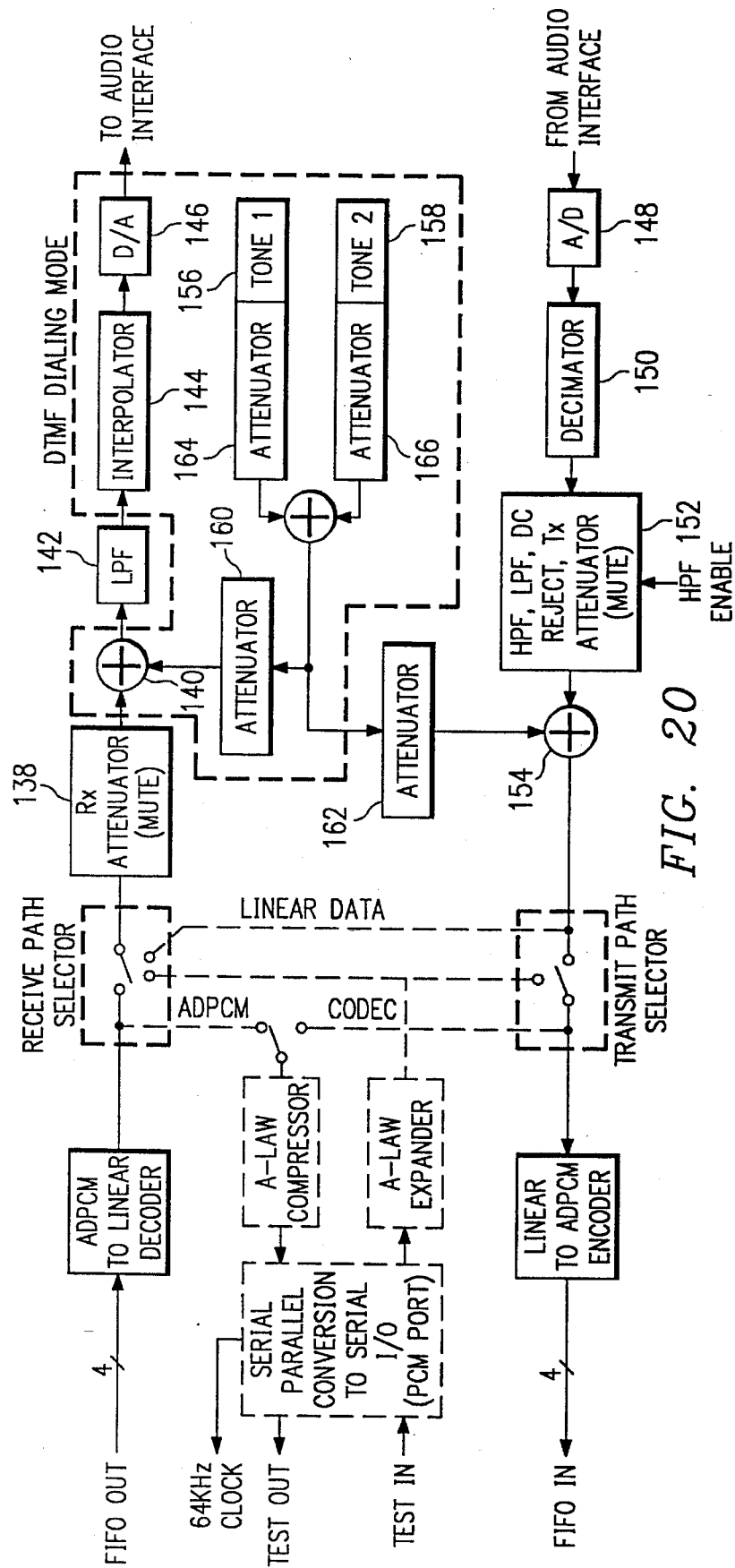
FIG. 20 is a block diagram of the audio path of a cordless telephone, excluding the analog interface.

As previously discussed, the keypad scanner mechanism of the present invention is well-suited for use in a cordless telephone, when included with an IC to be used in a cordless telephone. Referring now to FIGS. 19 and 20, shown therein is a cordless telephone of a type into which IC's including the in-circuit emulation capability mode according to the teachings of the present invention, for example, the exemplary IC previously described, may be incorporated. Such a cordless telephone includes a handset or terminal unit 2 (shown in FIG. 19) and a base unit or basestation 4 (shown in FIG. 20). Base unit 4 is connected by a telephone cord to an outlet or receptacle in a wall, a telephone pole, or another fixed structure, so that it may both receive and transmit telephone message signals through a telephone network line 6 and so that it also may be powered thereby. An antenna 8 on the handset 2, and a corresponding antenna 10 on the base station 4 are used to create a communication channel between the two units by the transmission and reception of radio waves. As is conventional, handset unit 2 includes a keypad 12 for making or dialing outgoing calls, and a mouthpiece and an earpiece, with which a microphone 14 and a loudspeaker 16 are, respectively, associated. A telephone number may be entered on the keypad 12, and corresponding information is transmitted over the communication channel to base unit 4, and thence to the telephone network line 6. Alternatively, when base unit 4 receives a message signal from the telephone network line 6 indicating that an incoming call is present, a signal from base unit 4 causes a ringing sound in handset unit 2 and a second ringing sound in base unit 4 to indicate the existence of the incoming call.

The standard maximum separation of such a handset unit 2 and base unit 4, which is called the service area, is about 300 meters, and is set by the Federal Communications Commission (FCC). Typically, there are ten duplex channels permitted for each system with the upper channel having a frequency in the 49 MHz band and the lower channel having a frequency in the 46 MHz band. Of course, such operating parameters are set by the FCC and do not form a part of the present invention.

The base station 4, like the handset 2, comprises a microphone 22, an ear piece 24, and a keypad 26. Likewise, both the handset 2 and the base station 4 include a ROM 28, 30, an EPROM 32, 34, an LCD and controller 36, 38, as well as a number of other elements which generally relate to the radio signals and power levels.

As may also be seen in FIGS. 19 and 20, an IC including the in-circuit emulator capability mode according to the teachings of the present invention is used in both the handset unit 2 and the base station 4. The IC is designated by reference numeral 18 in FIG. 19 and by reference numeral 20 in FIG. 20.

Based upon the foregoing, those skilled in the art should now fully understand and appreciate the improvements made by the teachings herein. Those skilled in the art should also fully understand and appreciate the value and merits of the in-circuit emulation capability mode described herein which may be incorporated in an IC and, in particular, in an IC for use in cordless telephones. On virtually every point made herein, however, further details may be found in the related cases listed in the cross-reference to related applications section above. Although those details are not necessary for those skilled in the art to practice the present invention or to comprehend its best mode of practice, those details may be useful to those skilled in the art and they may wish to refer to them.

Obviously, numerous modifications and variations are possible in light of the teachings herein. Accordingly, within the scope of the appended claims, the present invention may be practiced otherwise than as specifically described above.

What is claimed is:

1. A keypad scanner mechanism including a keypad having more than one key, incorporated with an integrated circuit including a microcontroller, comprising:

an activity detect mode for determining when at least one of said keys has been depressed;

a normal mode, triggered when at least one of said keys has been depressed during said activity detect mode, for identifying and reporting to said microcontroller depression of said keys; and a software means for debouncing a key depression, wherein said software means operates by:

receiving an interrupt signal at an interrupt port of said microcontroller when a key is depressed:

masking said interrupt port for a predetermined amount of time; and reading a keypad status register to obtain a stable identity of said key depression after said predetermined time is expired.

2. The keypad scanner mechanism of claim 1, wherein:

said integrated circuit includes a clock generator; and an output is generated to said clock generator when activity is detected during said activity detect mode.

3. The keypad scanner mechanism of claim 1, further comprising a multiple keys down code reported whenever two or more keys are simultaneously depressed.

4. The keypad scanner mechanism of claim 1, further comprising a no keys down code reported whenever no key is depressed.

5. A method for scanning a keypad comprised of more than one key, said keypad being incorporated with an integrated circuit including a microcontroller, comprising the steps of:

detecting depression of at least one of said keys on said keypad;

triggering a wake up of said integrated circuit in response to said detecting; and debouncing said keys using software, wherein said software comprises the steps of;

receiving an interrupt signal at an interrupt port when one of said keys is depressed;

masking said interrupt port for a predetermined amount of time; and reading a keypad status register to obtain a stable identity of said depressed key after said predetermined amount of time.

6. A keypad scanner mechanism including a keypad having more than one key, incorporated with an integrated circuit including a microcontroller, comprising:

an activity detect mode for determining when at least one of said keys has been depressed;

a normal mode, triggered when at least one of said keys has been depressed during activity detect mode, for identifying and reporting to said microcontroller depression of said keys;

a multiple keys down code reported whenever two or more keys are simultaneously depressed;

a status register for disclosing a stable identity of a debounced key; and an interrupt signal, generated if at least one of said keys is depressed since said status register was last read, said interrupt signal interrupts said microprocessor so that an interrupt port can be masked for a predetermined amount of time, said status register being read to obtain a stable identity of said key depression after said predetermined time has expired.

7. The keypad scanner mechanism of claim 6, wherein:

said integrated circuit includes a clock generator; and an output is generated to said clock generator when activity is detected during said activity detect mode.

8. The keypad scanner mechanism of claim 6, further comprising a no keys down code reported whenever no key is depressed.

* * * * *

UNITED STATES PATENT AND TRADEMARK OFFICE
CERTIFICATE OF CORRECTION

PATENT NO. : 5,512,893           Page 1 of 3
DATED      : Apr. 30, 1996
INVENTOR(S): Gulick, Dale E.

It is certified that error appears in the above-indentified patent and that said Letters Patent is hereby corrected as shown below:

Column 2, line 20        Replace "press ed"
                             With --pressed--

Column 3, line 57        Replace "depress ed"
                             With --depressed--

Column 6, line 53        Replace "(alebounce"
                             With --(debounce--

Column 8, line 23        Replace "59"
                             With --259--

Column 9, line 27        Replace "PSEN/then"
                             With --PSEN/ then--

Column 10, line 37       Replace "(R/D)"
                             With --(RxD)--

Column 11, table line 4  Replace "cycles,"
                             With --cycle,--

UNITED STATES PATENT AND TRADEMARK OFFICE
CERTIFICATE OF CORRECTION

PATENT NO. : 5,512,893
DATED : Apr. 30, 1996
INVENTOR(S) : Gulick, Dale E.

It is certified that error appears in the above-indentified patent and that said Letters Patent is hereby corrected as shown below:

Column 11, line 27  Replace "pchannel" With --p-channel--

Column 15, line 51  Replace "I C" With --IC--

Column 17, line 29 (table line 53)  Replace "and" With --any--

Column 20, line 15  Replace "PD7225" With --µPD7225--

Column 20, line 29  Replace "trans coder" With --transcoder--

Column 20, line 30  Replace "IN" With --In--

Column 20, line 36  Replace ":.nput)," With --input),--

UNITED STATES PATENT AND TRADEMARK OFFICE
CERTIFICATE OF CORRECTION

PATENT NO. :     5,512,893
DATED      :     Apr. 30, 1996
INVENTOR(S) :    Gulick, Dale E.

It is certified that error appears in the above-indentified patent and that said Letters Patent is hereby corrected as shown below:

Column 20, line 56     Replace "1k"
                           With --1k--

Column 20, line 64     Replace "Lvel"
                           With --Level--

Column 21, line 40     Replace "i n"
                           With --in--

Signed and Sealed this

Thirty-first Day of December, 1996

Attest:

BRUCE LEHMAN

*Attesting Officer*     *Commissioner of Patents and Trademarks*